United States Patent [19]

Lienau et al.

[11] Patent Number: 4,791,604
[45] Date of Patent: Dec. 13, 1988

[54] SHEET RANDOM ACCESS MEMORY

[75] Inventors: Richard M. Lienau, 2404 Sebald Ave., Redondo Beach, Calif. 90278; Kenneth E. Pope, Wagoner, Okla.

[73] Assignees: Joseph J. Bednarz; Richard M. Lienau, both of Los Angeles, Calif.

[21] Appl. No.: 889,256

[22] Filed: Jul. 23, 1986

Related U.S. Application Data

[63] Continuation of Ser. No. 580,537, Feb. 15, 1984, abandoned.

[51] Int. Cl.⁴ .............................................. G11C 11/02
[52] U.S. Cl. ........................................... 365/9; 365/2; 365/53; 365/62; 365/170
[58] Field of Search ...................... 365/9, 53, 2, 60, 62, 365/170

[56] References Cited

U.S. PATENT DOCUMENTS

| | | | |
|---|---|---|---|
| 3,651,311 | 3/1972 | Berezin et al. | 365/53 |
| 3,701,126 | 10/1972 | Reichard | 365/9 |
| 3,852,725 | 12/1974 | Ogura et al. | 365/53 |
| 4,027,300 | 5/1977 | Braun | 365/2 |

Primary Examiner—James W. Moffitt
Attorney, Agent, or Firm—Beehler, Pavitt, Siegemund, Jagger, Martella & Dawes

[57] ABSTRACT

A sheet random access memory (SHRAM) is a truly random access, nonvolatile and transportable memory characterized by the cell density, size and power requirements of smaller dynamic memories but having the nonvolatile character of core memories or magnetic disks and tape and the rugged transportability of magnetic disk and tape. The SHRAM is characterized by a memory media comprising a two dimensional magnetic substrate and a fixed driving device for writing and reading into the substrate and a fixed sensing device for sensing the information at each cell location. In one embodiment the fixed sensing device is a sensing line in close proximity to a cell location. In a second embodiment, a fixed sensing device includes a Hall effect device which senses the magnetic configuration of the cell. In a third embodiment, the fixed sensing device includes an SCS thyristor in which the cathode gate is coupled to the magnetic configuration of the cell. The memory media includes not only a homogeneous two dimensional substrate, but also ferrite cores formed into the substrate by photolithographic techniques wherein the information is stored within the core and read by the sensing device from a gap defined by the core. Memory cells according to the invention can thus be arranged and organized to form destructive readout RAMs, or nondestructive readout RAMs, in both serial and parallel form.

19 Claims, 10 Drawing Sheets

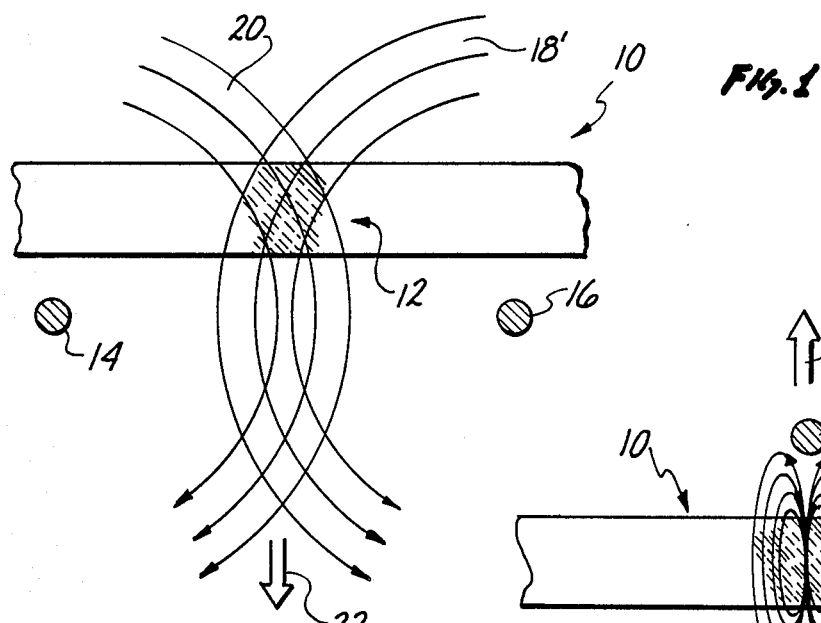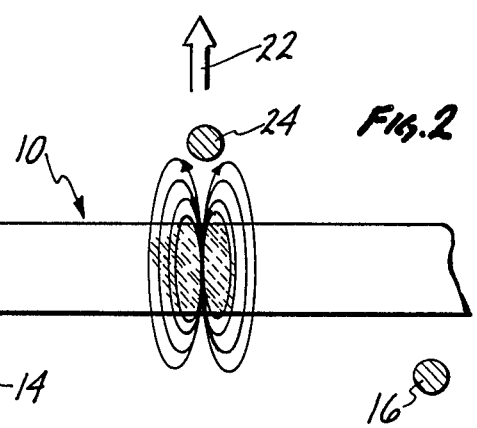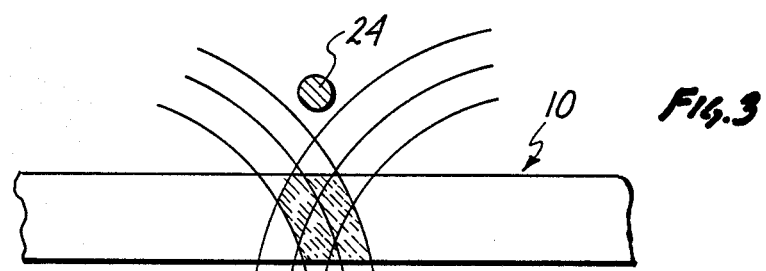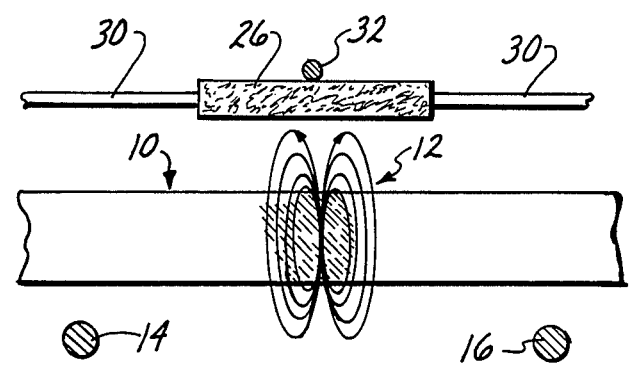

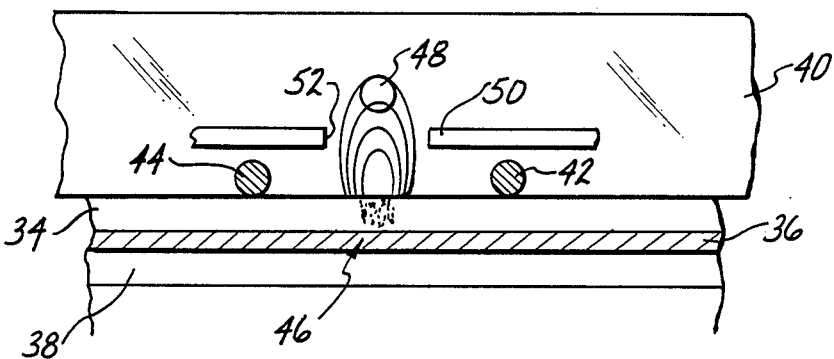
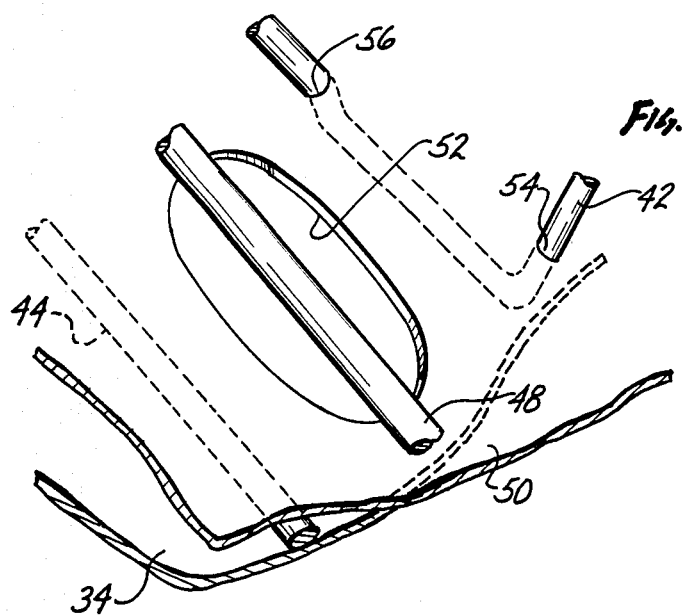
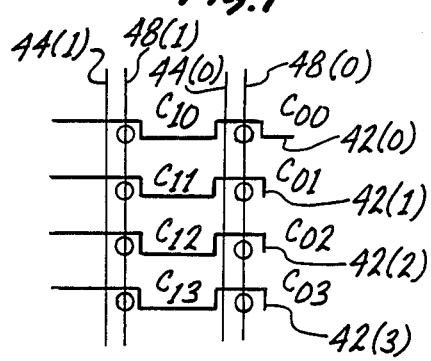
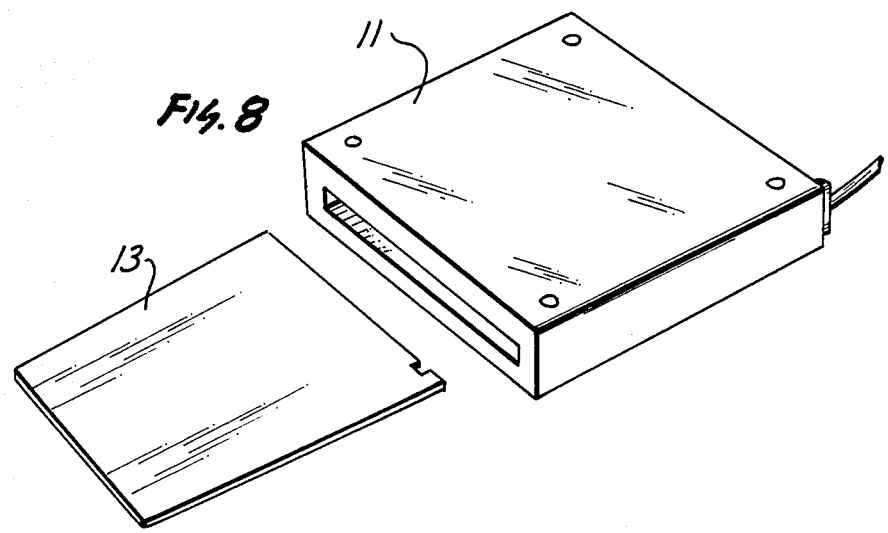

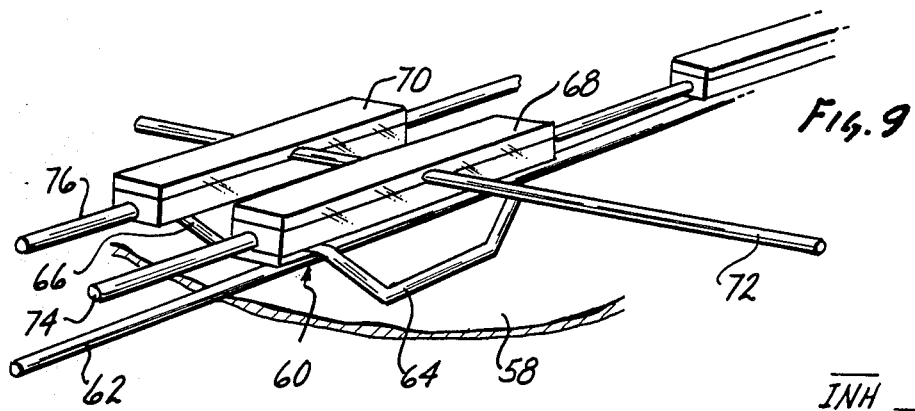
Fig. 9
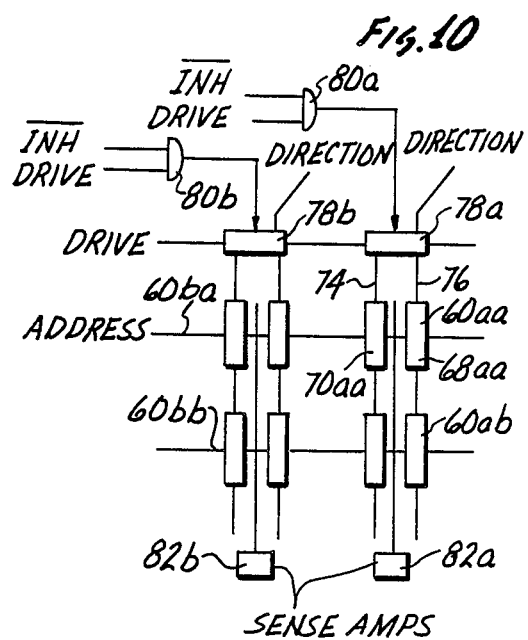
Fig. 10
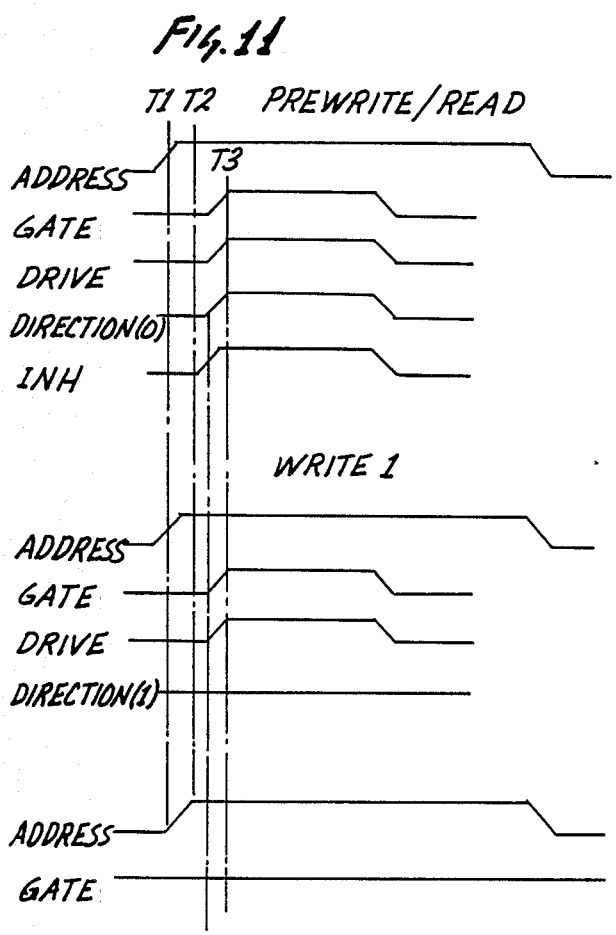
Fig. 11
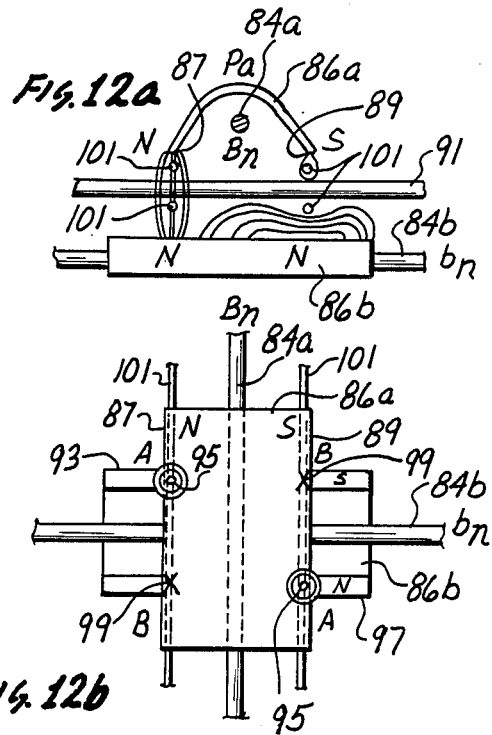
Fig. 12a
Fig. 12b

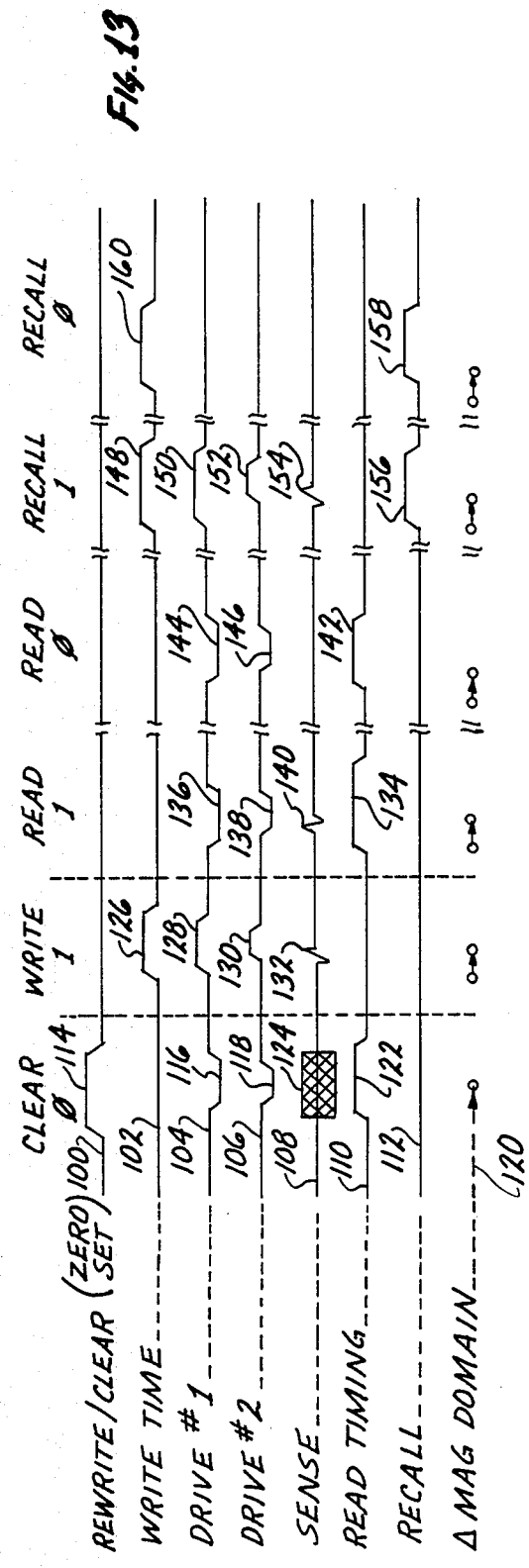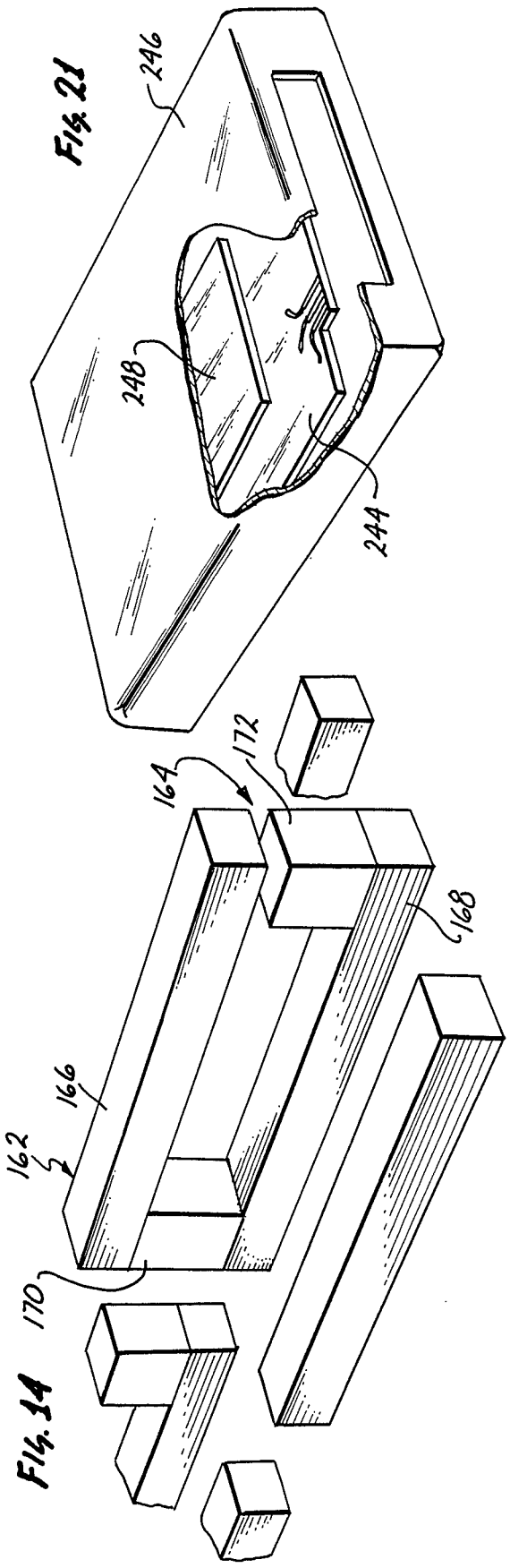

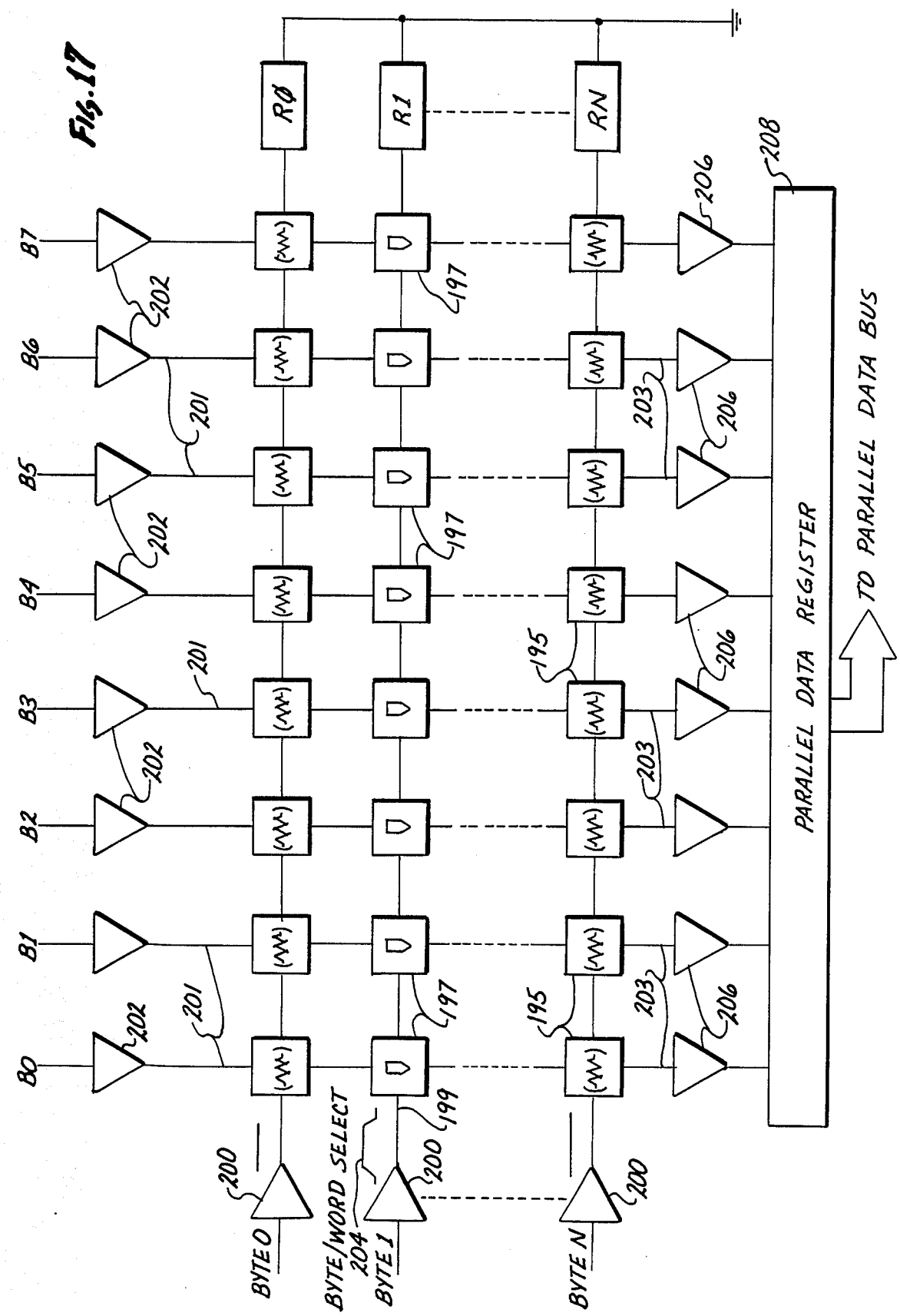

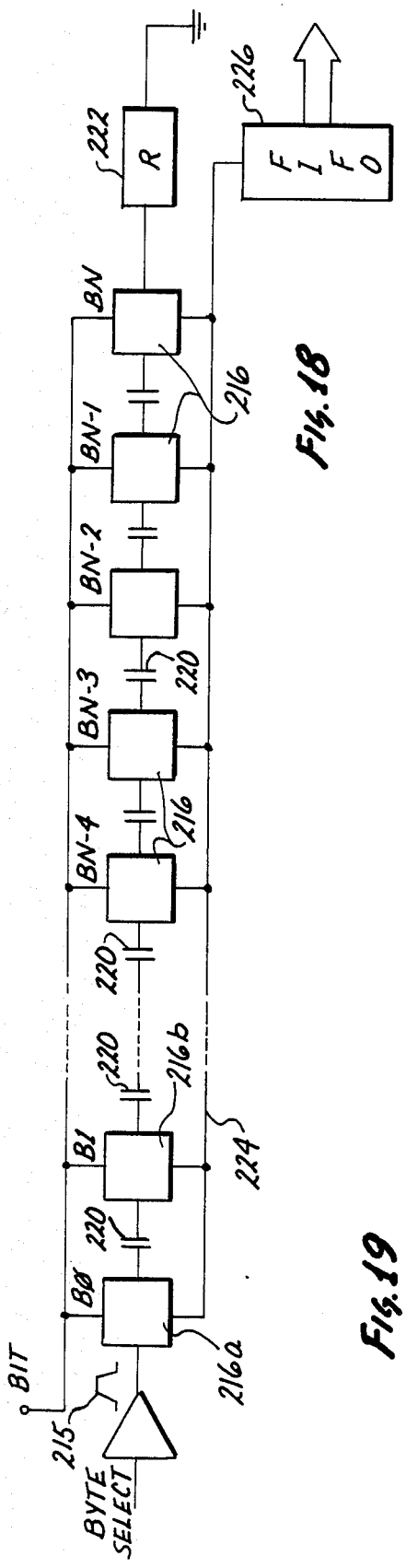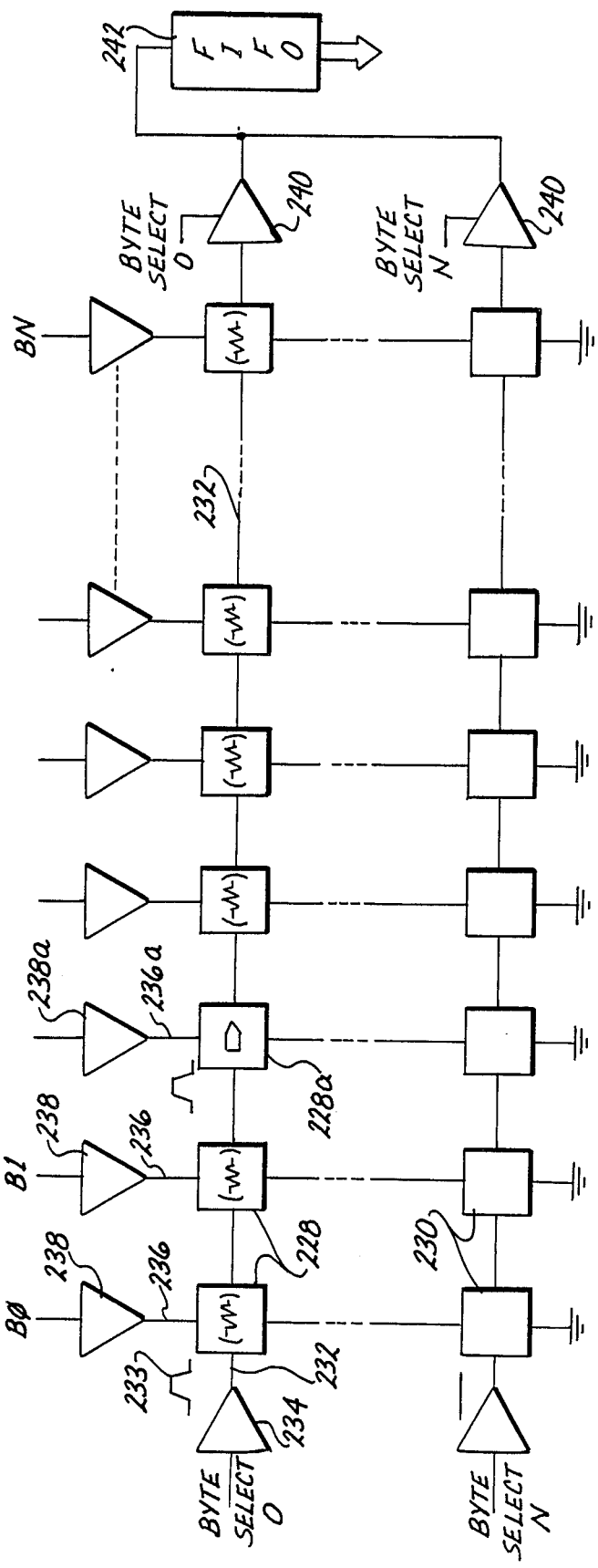

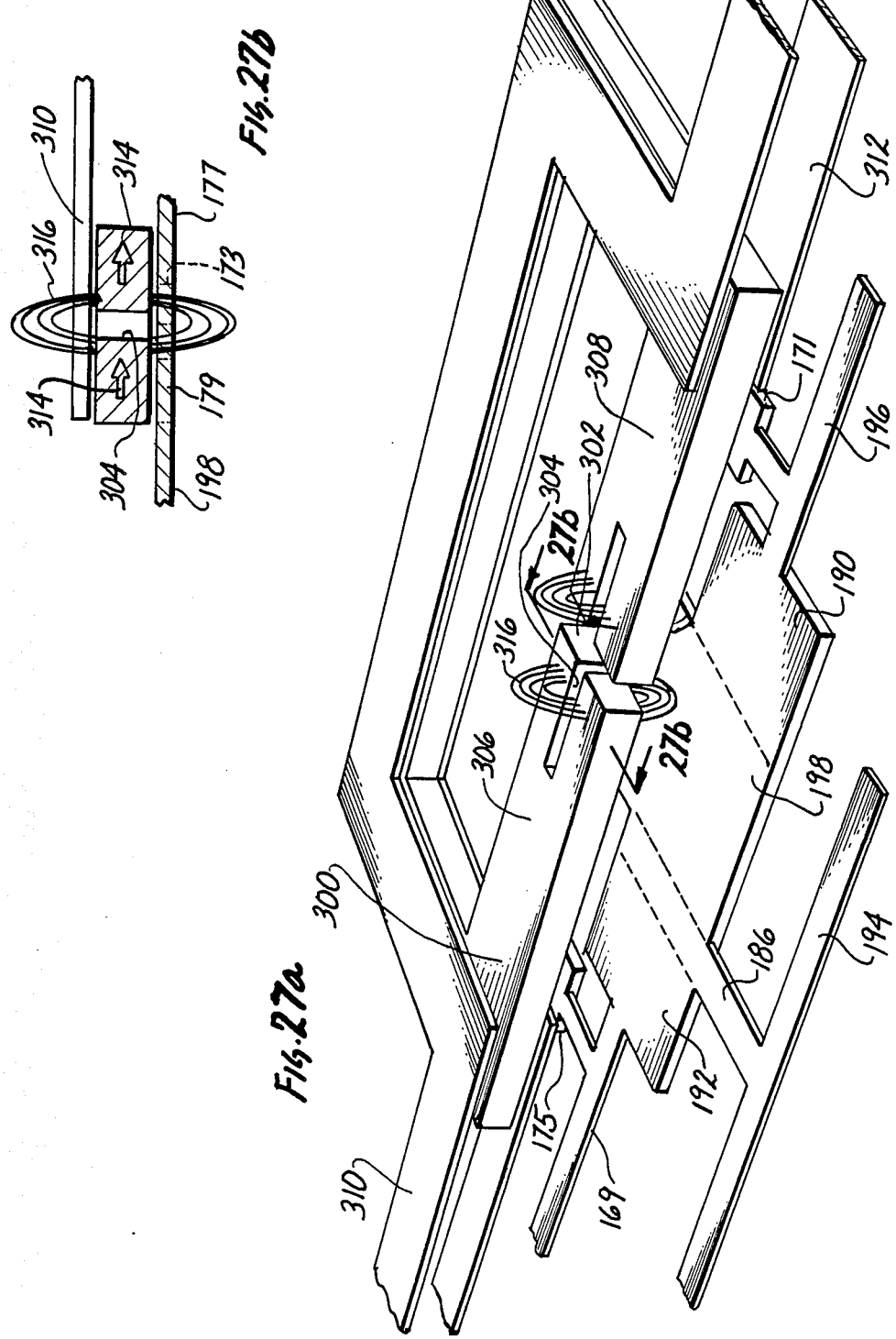

SHEET RANDOM ACCESS MEMORY

This is a continuation application of U.S. Ser. No. 580,537 filed Feb. 15, 1984 now abandoned.

BACKGROUND OF THE INVENTION

1. Field of the Invention

The present invention relates to the field of nonvolatile magnetic memories. In particular, the invention relates to a nonvolative magnetic memory which is transportable and does not incorporate or necessitate mechanical moving parts or moving magnetic domains or bubbles.

2. Description of the Prior Art

The first commercial random access nonvolatile magnetic memories were magnetic core systems in which circular magnetic ferrite cores were used as memory elements, were arranged in large 3-dimensional arrays, and were coupled to selected wire wraps for reading and writing. These first magnetic arrays were physically large, required large amounts of power and consequently were characterised by high heat dissipation, and were very expensive to fabricate.

Dynamic semiconductor memory arrays were then devised and are now predominantly used in small systems. However, a dynamic memory is volatile and because of this volatility cannot be transported. Practical nonvolatile memories thus remain to this date in the form of tape or magnetic disk. In both cases, tape and magnetic disks must be electromechanically read which introduces inherent unreliabilities, slowness in information transfer, and prevents such memory media from being truly random access. Furthermore, many of the nonvolatile magnetic memories such as tape and disk are not transportable or are transportable only under very carefully controlled conditions which are easily violated. Hard disks are, for example, hermetically sealed in their controllers and are totally nontransportable.

In addition to the foregoing memory systems, the prior art has also devised magnetic bubble memories wherein the presence or absence of a magnetic domain or bubble at a predetermined location within a supporting material is sensed and provides the operative memory element. However, in each of the bubble memories heretofore devised the presence or absence of the magnetic bubble could be sensed only if the magnetic bubble physically propagated in a predetermined manner through the supporting material, or if the stationary magnetic domain were sensed using special techniques such as sonic waves. For example, Myer, "Coercivity Control and Detection Signal Generating Pattern for Uniaxially Anisotropic Ferromagnetic Crystal Platelets", U.S. Pat. No. 3,971,038 discloses a nonvolatile memory system wherein a 2-dimensional lattice array of dots of magnetic susceptible material such as permalloy is in contact with a plane surface of uniaxially anisotropic ferromagnetic crystal platelets. The platelets have their major plane surface cut perpendicularly to the "easy" axis of magnetization of the crystal in order to be capable of sustaining movable, cylindrical, magnetic domains therein. Magnetic domains are moved between predetermined locations in the crystal by a magnetic field generated by electric drive signals in field generating conductor loops. By providing an array of dots, each of which is of a size having a maximum dimension which is a small fraction of the minimum diameter of the smallest bubble sustainable in the crystal, it is possible to control the coercivity of the crystal platelet, and thereby achieve some measure of stability of bubble position by the axis conductors and a greater temperature independence for the necessary biasing field. The lattice array which is used for coercivity control can also be used to sense a signal generated by the bubble as it is moved with respect to the array. As with virtually all bubble memories, movement of the bubble is used as the physical memory mechanism.

In another example shown by Kinsner et al, "Sonic Magnetic Domain Sensor", U.S. Pat. No. 4,094,003, a system is described wherein the presence or absence of a magnetic bubble in a magnetostrictive material layer is detected through the use of sonic waves. A sonic device launches sonic wave pulses which pass in the vicinity of a magnetrostrictive material layer. The sonic wave pulses stresses the magnetostrictive material and when the magnetostrictive material is magnetically influenced by a bubble, the stress changes or rotates its magnetization thereby inducing an electric signal in a conductor. When a bubble is not near the magnetostrictive material, no signal will be produced.

However, all bubble memories are susceptible to slow-switching rates, high temperature dependence, and low stability of the bubble position. Therefore, the nonvolatility of bubble memories is unreliable as a practical matter and the circuit systems and methodologies used for practical utilization of bubble memories are complex and often difficult to integrate into the more conventional circuitry of present computer and memory systems.

Therefore, what is needed is a simple, nonvolatile magnetic memory which is truly transportable, which provides true random access to the information stored therein, which does not necessitate the use of electromechanical components for reading or writing, and which is readily compatible with presently available computer systems.

BRIEF SUMMARY OF THE INVENTION

The present invention is a nonvolatile, random access memory comprising a substrate including a plurality of ferromagnetic domains and a corresponding plurality of distinguishable locations. A fixed drive device selectively generates an electromagnetic field within the substrate at a selected one of the distinguishable locations in order to alter the ferromagnetic domain into one of at least two distinct magnetic configurations corresponding to a 0 and 1. The memory further comprises a fixed sensing device for selectively sensing a selected one of the plurality of distinguishable ferromagnetic domains in order to determine which of the two magnetic configurations may have been assumed by the substrate at the distinguishable location. By reason of this combination of elements a true, random and nonvolatile mass memory is provided.

In the illustrated embodiment, the memory is characterized by a substrate which includes at least in part a two-dimensional layer of ferromagnetic material disposed on and sandwiching an innerlying substrate so that the substrate provides a double sided ferromagnetic surface. Each side independently provides a layer for the plurality of distinguishable locations.

In one embodiment, the fixed drive device comprises a pair of conductive lines disposed in proximity to the substrate and parallel at least for a portion of their length. The pair of conductive lines provides a conductive path for parallel and antiparallel currents as appropriate. A magnetic field corresponding to the first and second magnetic configurations is selectively impressed upon the distinguishable location within the substrate. The fixed sensing device comprises a conductive line disposed in proximity of the substrate corresponding to the distinguishable location. The transition of the magnetic state at the distinguishable location between the first and second magnetic configurations thus induces a flux reversal signal in the sensing conductive line.

In another embodiment, the fixed sensing device comprises a Hall effect device disposed in the proximity of the substrate and the distinguishable location. The magnetic configuration of the distinguishable location is impressed upon the Hall effect device thereby creating a response in the device which is indicative of the first or second magnetic configuration assumed at the corresponding distinguishable location in the substrate.

In yet another embodiment, the fixed sensing device comprises a semiconductor thyristor electromagnetically coupled to the magnetic configuration established in the distinguishable location in the substrate. More particularly, the substrate comprises a plurality of ferromagnetic cores formed in the substrate. Each core provides a magnetic circuit through the core and across a gap defined by the core. The fixed sensing device senses the magnetic field established within the core across the gap.

According to the invention, the nonvolatile sheet random access memory devices as described above can then be organized in a number of ways to form truly random access, nonvolatile and transportable memories, both in parallel and serial form.

These and other advantages and embodiments of the present invention can best be understood by first briefly considering the following drawings wherein like elements are referenced by like numerals.

BRIEF DESCRIPTION OF THE DRAWINGS

FIG. 1 is a diagrammatic sectional view of the invention which illustrates the physical principle of writing information into the memory.

FIG. 2 is a diagrammatic sectional view of the invention illustrating the physical principle of storage of information in the sheet random access memory.

FIG. 3 is a diagrammatic sectional view of the invention illustrating the physical principle of reading information from the memory.

FIG. 4 is a diagrammatic sectional view of a second embodiment of the invention using Hall effect devices.

FIG. 5 is a diagrammatic sectional view of a third embodiment of the invention.

FIG. 6 is a diagrammatic perspective view of the embodiment of FIG. 5.

FIG. 7 is a schematic view of a plurality of cells of the type shown in FIGS. 4 and 5.

FIG. 8 is a diagrammatic perspective view of a sheet read/write device used with the invention.

FIG. 9 is a partial cutaway perspective of a fourth embodiment of the invention.

FIG. 10 is a schematic diagram corresponding to the circuit element shown in FIG. 9.

FIG. 11 is a timing diagram of the circuit described in connection with FIGS. 9 and 10.

FIGS. 12a and 12b are a diagrammatic sectional view of a fifth embodiment of the invention.

FIG. 13 is a timing diagram corresponding to the performance of the device described in connection with FIG. 12.

FIG. 14 is a diagrammatic view of portions of multiple integrated circuit magnetic domains deviced according to a sixth embodiment of the invention.

FIG. 17 is a diagrammatic view of a random access memory utilizing the memory cells of the embodiment of FIG. 4.

FIG. 18 is a schematic of a serial memory incorporating the embodiment of FIG. 4.

FIG. 19 is a schematic of a parallel memory incorporating the embodiment of FIG. 4.

FIG. 21 is a partially cut-away perspective view of a transportable package according to the invention.

FIG. 27a is a perspective illustration of another embodiment where a thyristor is used as a sense amplifier.

FIG. 27b is a sectional view of the embodiment of FIG. 27a taken through lines 27b—27b.

Figure 15:
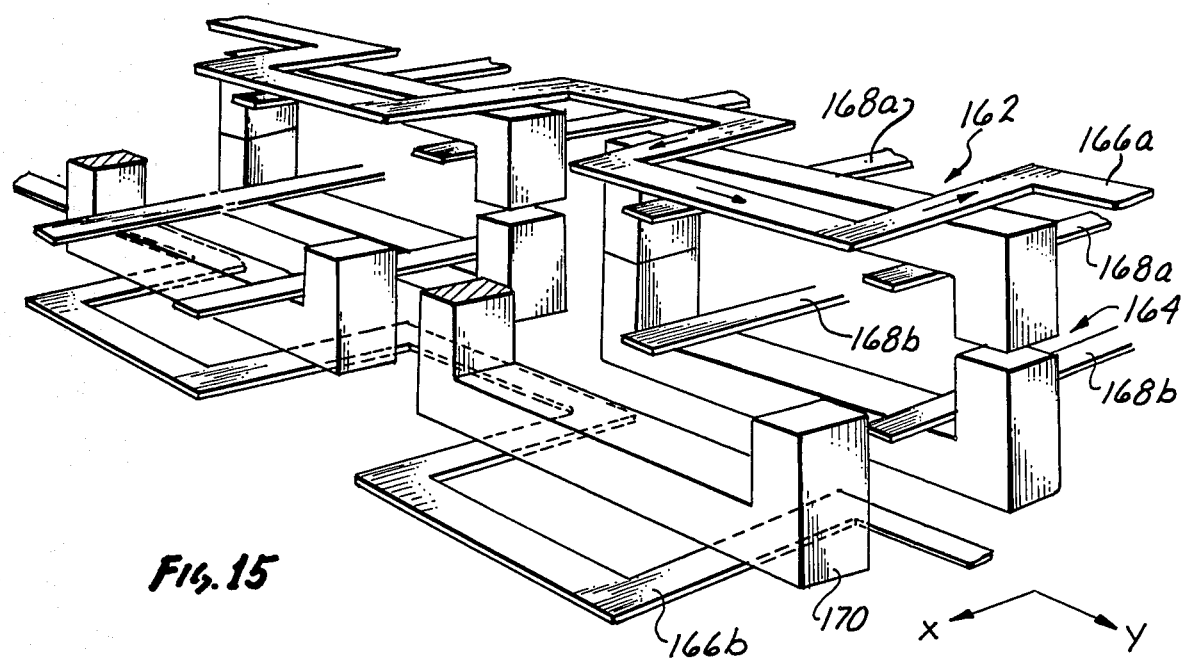
FIG. 15 is a diagrammatic view of a partially completed memory cells of the embodiment of FIG. 14.

The invention and its various embodiments may be better understood by now considering the above Figures in light of the following detailed description.

DETAILED DESCRIPTION OF THE PREFERRED EMBODIMENTS

As described below, the invention is a memory system that is truly nonvolatile, incorporates no electromechanical components for reading or writing, is transportable without special precautions, and is a true random access memory. For the purposes of this specification, such a memory shall be termed a sheet random access memory of SHRAM. SHRAM has the memory performance characteristics of a magnetic core memory with the memory density and power characteristics of a dynamic random access memory. The SHRAM is based upon a fixed magnetic domain defined in a magnetic substrate wherein the information is written and read into the magnetic substrate by a memory cell circuit fabricated by conventional semiconductor photolithographic or integrated circuit techniques. Before turning to the structural details of the integrated SHRAM cell, consider first the physical basis upon which the operation of SHRAM depends as best depicted in FIGS. 1-3.

Turn now to FIG. 1, which is a simplified, diagrammatic sectional view of a single cell. A planar magnetic substrate 10 is provided and is comprised of conventional ferromagnetic material. A magnetic memory cell, generally characterized by reference numeral 12 is formed in substrate 10 by applied magnetic fields from a pair of drive conductors 14 and 16 lying below substrate 10. The steady state field around a straight conductor is a circular field as depicted by electric field force lines 18 whose direction is given by the right hand rule. In other words, if the current through conductor 16 is upward and out of the plane of FIG. 1, the magnetic field lines 18 are generally circular and counterclockwise about conductor 16. Similarly, if the current through conductor 14 is downward and into the plane of FIG. 1, the magnetic field lines 20 from conductor 14 will be generally circular and clockwise as depicted in FIG. 1. The counterclockwise magnetic field lines 18 generated by the steady state current in conductor 16 and the clockwise magnetic field lines 20 generated by the steady state current flowing in the opposite direction in conductor 14 are vectorially reinforced in magnetic cell 12, thereby tending to orient the magnetic domains within cell 12 in a generally downward direction as symbolically depicted by arrow 22. After the currents in conductors 14 and 16 are turned off, the magnetic domain in cell 12 will remain in the direction as symbolically indicated by arrow 22 best depicted in FIG. 2 which is a diagrammatic sectional view of the cell of FIG. 1 after information has been written into cell 12.

If, on the other hand, the current through conductors 14 and 16 were in the same direction, either both out of the plane of FIG. 1 or into the plane of FIG. 1, then the magnetic field lines 18 and 20 would both be clockwise or counterclockwise with the result that there would be substantial vectorial cancellation of the magnetic fields in cell 12. Since cell 12 is an area of finite volume, and further since cell 12 does not lie on the line connecting conductors 14 and 16, some residual magnetic field will nevertheless result from the vector sum of the superimposed opposing magnetic fields from conductors 14 and 16. However, this resultant field will generally be parallel to the plane of substrate 10 and of substantially smaller magnitude than the vector sum of the fields when the fields are additive as depicted in FIG. 1. The direction and magnitude of the cancelling field in that case will be insufficient to flip the magnetic domain which has been preestablished in cell 12 as diagrammatically depicted in FIG. 2.

Similarly, if the steady state current through conductor 14 were instead out of the plane of FIG. 1, magnetic field lines 20 would be counterclockwise. Similarly, if the current in conductor 16 were into the plane of FIG. 1 the magnetic field lines 18 would be clockwise. Fields 18 and 20 would gain constructively add, but would add to form a net vector sum which would be directed downwardly in FIG. 2 or opposite to that of the direction indicated by arrow 22. In that situation, the magnitude and direction of the applied magnetic field upon cell 12 would reverse the magnetic domains in cell 12 thereby writing an opposite state into the cell. Thus, it can be readily appreciated that a "1" can be symbolized by a magnetic domain of the orientation indicated by arrow 22 in FIG. 1, while a "0" may be signified by an oppositely oriented magnetic domain or vice versa.

In the embodiment of FIGS. 2 and 3, a sense line 24 is provided immediately above cell 12 on the opposite side of substrate 10 from drive conductors 14 and 16. To read the information stored in cell 12, appropriate currents are provided through drive conductors 14 and 16 to reset the magnetic domain in cell 12 to an initialized condition, such as the downward magnetization shown by arrow 22 in FIG. 2. If the information in cell 12 is already in the downward state or initialized state, or is considered a 0, an attempt to reset a 0 into cell 12 will leave the magnetic domain in cell 12 as it is and no magnetic domain reversal will be sensed in sense conductor 24. However, if a 1 had been written into cell 12 when the reset currents were flowing through conductors 14 and 16, the upward magnetic domain in cell 12, representing a 1, would be reset to a downward magnetic moment so that sense conductor 24 would sense a change and magnetic field would change from a value $H_0$ to $-H_0$. The change in magnetic field is sensed as a current within sense conductor 24 which is amplified provided as a readout of the stored information.

Thus, the first embodiment of FIGS. 2 and 3 illustrate a destructive SHRAM readout. Destructive readout is well known in conventional ferrite core memory systems and the means for then rewriting the destroyed information into the memory cell are similarly well known.

Turn now to FIG. 4 wherein a second embodiment of a memory cell is diagrammatically depicted in sectional view wherein like elements are referenced by like numerals. The magnetic moment stored within cell 12 is now read by a Hall effect device generally denoted by reference numeral 26. Hall effect device 26 is diagrammatically depicted by a substrate block disposed above and in the proximity of the magnetic field arising from the stored magnetic domain in cell 12. A current is supplied through conductors 30 through device 26. As is well known, a magnetic field in a semiconductor exhibiting the Hall effect produces a transverse voltage or current across the ferromagnetic substrate 10 in a direction perpendicular to the flow of current established through conductors 30. Therefore, sensing conductors, one of which conductors 32 is shown in FIG. 4, are provided on each side of ferromagnetic substrate 10 and provide a means of sensing the Hall effect voltage and current created by the magnetic field from the domain stored in cell 12. The direction of the Hall current for the size of the voltage will depend upon the direction of the magnetic field impressed on substrate 10 from cell 12. Therefore, by reading the polarity of the Hall effect voltage or current, it can be determined whether a 0 or 1 has been written into cell 12. The polarity may be sensed to provide a nondestructive readout, or the field reversal described in connection with FIGS. 1-3 may be used and sensed in the Hall effect device for a destructive readout.

Turn now to FIG. 5 where in a third embodiment of a memory cell using the physical principles described in connection with FIGS. 1-3 is depicted in diagrammatic sectional view. A ferromagnetic substrate 34, taking the place of substrate 10 of FIG. 1, is disposed upon a base 36 which also serves as a stiffener and may include mu metals to provide a magnetic shield between magnetic substrate 34 and lower magnetic substrate 38 disposed beneath base 36. The device of FIG. 5 is thus a double sided memory wherein the circuit structure, depicted in detail above magnetic substrate 34, must be understood as also being replicated in lower magnetic substrate 38 disposed therebeneath. For the purposes of clarity, the read/write structure of the memory cell corresponding to substrate 38 has been omitted from the Figure.

The read/write structure corresponding to substrate 34 is included within a layer 40. Included within layer 40 is a pair of drive conductors 42 and 44 corresponding to conductors 14 and 16 of FIG. 1 respectively. Conductors 42 and 44 will thus write information into a cell region, generally denoted by reference numeral 46. Directly above and in line with cell 46 is a conductive sense line 48 corresponding to sense line 24 of FIGS. 1 and 2. Between sense line 48 and drive conductors 42 and 44 is a magnetic barrier layer 50 containing mu metal or other magnetically shielding constituents. Magnetic barrier 50 has an aperture 52 defined therein above cell 46 to permit magnetic interaction between sense line 48 and cell 46 while substantially shielding sense line 48 from the magnetic fields created by nearby drive conductors 42 and 44.

The cell structure as shown in sectional view in FIG. 5 is also depicted in diagrammatic perspective view in enlarged scale in FIG. 6. In the embodiment of FIGS. 5 and 6 conductor 42 is characterized as a drive line and conductor 44 as a select line. Each line carries enough current necessary to produce a magnetic field which will cause a domain flip in cell 46. Normally the currents are carried in select line 44 and drive line 42 in a direction such that their magnetic fields at cell 46 substantially cancel. Magnetic barrier 50 minimizes the effect of these currents on sense line 48. Magnetic flux lines from cell 46 are focused through aperture 52 on the exposed portion of sense line 48. A current is induced in sense line 48 when the magnetic field collapses and rises as the magnetic domain in cell 46 is reversed.

Turn now to FIG. 7 which is a diagrammatic plan view of the plurality of cells of the type described in connection with FIGS. 5 and 6. Eight cells are depicted and are denoted as cells $C_{00}$–$C_{03}$ and $C_{10}$–$C_{13}$. A select line 44(0) is provided for each of the cells C00–C03. These same cells share a common sense line 48(0). Each cell has a separate drive line 42(0)-42(3). The same drive lines are provided for cells $C_{10}$–$C_{00}$, which in turn have their own separate common select lie 44(1) and common sense line 48(1). Consider, for example, cell $C_{01}$. Drive line 42(1) is disposed across the width of substrate 34 and above magnetic shield 50 to prevent any undesired interaction with any underlying cells. Drive line 42(1) penetrates magnetic shield 50 at point 54 (FIG. 6), and thence is disposed parallel to select line 44(0) for the purpose of providing the appropriate magnetic field to the cell. After running parallel to select line 44(0) a sufficient distance, drive line 42(1) again penetrates magnetic shield 50 at point 56 (FIG. 6). Turning again to FIG. 7, drive line 42(1) then is disposed generally perpendicular to common select line 44(0) and is disposed to the next adjacent cell $C_{11}$. At cell $C_{11}$ drive line 42(1) will again penetrate magnetic shield 50, turn and lay generally parallel to common select line 44(1) and then repenetrate magnetic shield 50 to turn and be disposed at the next adjacent memory cell.

Thus, by inspection of FIG. 7 it is readily apparent that any cell can be randomly accessed through appropriate activation of the X and Y grid provided by the select and drive lines. Assume for example that a positive current on the drive line and a negative current on the select line will write a 1 into the corresponding cell. Similarly, a negative current on the drive line and a positive current on the corresponding select line will write a 0 into the cell. If the currents on the select and drive lines are both positive or negative, then a cancelling field is produced and neither a 1 nor a 0 is written. Now consider the following read/write cycle. A word is represented by adjacent cells, namely $C_{00}$, $C_{10}$, $C_{20}$, . . . All the select lines 44(J) are then provided with a positive current. Only one of the drive lines, corresponding to the word which is selected for the write cycle, is provided with a negative current, each of the other drive lines having a positive current. For example, assume that drive line 42(0) has a negative current. Thus, according to our assumed convention, 0s will be written into each of the cells $C_{00}$, $C_{10}$, $C_{20}$. . . . Thereafter during a read cycle, all of the drive lines are provided with a positive current. Those bit locations in which a 1 is to be written have their corresponding select line provided with a negative current, otherwise the select line retains a positive current.

When the read cycle is then executed 0s will be written into each bit location as before. However, those bit locations in which a 1 was previously written will suffer a domain flip. This reversal of magnetic field will produce a current in the corresponding sense lines 48(J), which lines will then provide a parallel readout. The word which is read out will be temporarily stored within a register and then during a housekeeping cycle will be rewritten into the read word location since the readout in the case of the embodiment of FIGS. 5–7 is destructive Although the above read/write cycle contemplates a positive or negative current flowing in each of the selected drive lines at all times, it is also possible that such lines could be tristated, in other words that positive and negative currents could be supplied as described with an additional state of no current if desired. Thus, rather than having the paired sections of the select and drive line producing a cancelling field, in these instances the field which would be produced by one of the lines would be of insufficient magnitude to flip the domain.

However, as depicted in FIG. 7 it can be seen that the drive lines will cross the sense lines near each cell location. Therefore, it can be expected that as the drive lines change the direction of its current that the sense lines at each cell location crossing the changing drive line will pick up a noise signal whether or not there is a domain reversal in the corresponding cell. Although this could be avoided by providing an additional magnetic shield between that portion of the sense lines above magnetic shield 50 and crossing over sense lines 48, some noise or crosstalk would be expected from the current reversals within select line 44, drive line 42 and sense line 48.

Turn now to FIG. 9 wherein each of these disadvantages are avoided. Magnetic substrate 58 corresponding to substrate 10 in FIG. 1, as before, includes a magnetic region, generally denoted by reference numeral 60. Directly over magnetic region 60 is a conductive sense line 62 and a pair of drive lines 64 and 66. In this case, drive lines 64 and 66 are each connected to a shunting switch or device 68 and 70 respectively, which selectively shunts a current through drive lines 64 and 66 under the control of corresponding address line 72. Shunt devices 68 and 70 are provided with power or current from drive lines 74 and 76 respectively. Upon activation of address lines 72, the current, which will normally flow through shunt switches 68 and 70 will be diverted through drive lines 64 and 66 for a period of time as determined by the active status of address line 72.

The operation of the circuit as shown in FIG. 9 can better be understood by now considering the schematic of a plurality of such circuits as shown in FIG. 10. Turning to FIG. 10, four cells are depicted, namely 60aa –60bb. Cell 60aa is associated with shunt switches 68aa and 70aa of the type described in connection with FIG. 9. Each of the other cells, 60ab–60bb, similarly have a pair of shunt devices as well. Drive line 74 and 76 are then coupled to drivers 78 which provides the current direction to drive lines 74 and 76 depending upon the operation of the read/write cycle as described in greater detail in connection with FIG. 11 below. Each driver 78a and 78b in turn is triggered by a gate signal from the output of and gates 80a and 80b respectively. The inputs to each of these gates is a signal drive, and inhibit signal INH.

Turn now to the timing diagram of FIG. 11 wherein the operation of the circuit of FIG. 10 is described. As before and as depicted in FIG. 9 in the pre-write/read cycle, all of the bits in a word are set to 0. The 0 direction of current is determined by the signal, DIRECTION. When DIRECTION is active, the flow of current through drive lines 74a and 76a, for example will be such as to write a 0 in each bit cell to which such currents are directed. At time T1 the address signal goes active. Thereafter, after the address signal has settled at time T2, the inhibit signal, INH goes to a logical one. The drive signal enables the drivers 78a, 78b ... and causes a 1 to be presented as the GATE signal at the output of gates 80a, 80b .... Therefore, a 0 will be written into each bit cell corresponding to the active address line, line 72a for example.

Thereafter during a write cycle the address again goes active by time T1. However, if a 1 is to be written in any column, inhibit, INH goes to a logical high and a drive signal is transmitted, namely the GATE signal goes high as shown in FIG. 11 and a current is placed upon the drive lines 74 or 76. However, at this time the DIRECTION signal is and remains low so that a 1 is written rather than a 0, namely the direction of current in lines 74 and 76 will be reversed when the signal, DIRECTION, is low.

Similarly if a zero is to be written, ADDRESS will go active at T1 and INH remains logically low. Therefore, GATE remains low and the 0, which was loaded in a prewrite cycle is unaffected. This reduces noise in the memory by leaving DIRECTION quiescent.

During a read cycle, the same cycle as shown in the prewrite cycle is practiced. The address select line is chosen and goes active. All of the bit locations corresponding to the addressed line are sampled when the reversing direction line goes active and 0s are then read into each of the bit cells. Those domains which flip will provide an output at the corresponding sense amplifiers 82a, 82b ...(FIG. 10). The destroyed data is temporarily stored and rewritten in a subsequent restore write cycle. Consider for example the following sequence. Assume the memory is loaded with a configuration of 1's and 0's and a new word is to be written into 60aa, 60ba, ... A prewrite cycle is then executed for the row addresss corresponding to 60aa, 60ba .... The new word is received and INH at each of the columns is appropriately driven, i.e. INH and thus GATE will be active if a 1 is to be written and inactive if a 0 is to be written or remain in the addressed cell. A write 1 or write 0 cycle as shown in FIG. 11 is then executed. The new word is now stored in the addressed row. If it is to be read, then a prewrite/read cycle is executed as shown in FIG. 11 and sense amplifies 82a, 82b ... will read out the data. Now zeros will be restored to each cell 60aa,60ba ... in the addressed row. The read word is temporarily stored in a register (not shown) and in a housekeeping cycle rewritten into the same addressed row by executing a write 1 and write 0 cycle for each column as appropriate.

In each of the embodiments thus far described, the drive line created a magnetic field which penetrated the magnetic substrate due to its proximity. Turn now to FIGS. 12a and 12b, wherein another embodiment is illustrated wherein perpendicularly crossed drive lines 84a and b are surrounded by corresponding parabolic focusing elements 86a and b. As the magnetic field generated by drive lines 84a and b rises and collapses, passive highly permeable parabolic focusing elements 86a and b act much as a paramagnet to focus the magnetic field from lines 84 to the edges of permeable parabolas 86a and b. Permeable parabolas 86a and b thus form a curved magnetic sheet wherein one edge 87 may be configured to form a north pole while the opposing edge 89 assumes a south pole induced by a current within the corresponding drive line 84a or b. Permeable parabolas 86a and b are orthogonally oriented with respect to each other and are parallel with their corresponding drive lines 84a and b respectively. A ferrite sheet 91 is disposed between upper drive line 84a and permeable parabola 86a and lower drive line 84b and permeable parabola 86b.

Thus, as best illustrated in top elevational view in FIG. 12b, left edge 87 of upper parabola 86a has been induced to form a north pole face while upper edge 93 of lower parabola 86b (shown in dotted outline) has been induced by its corresponding drive line 84b to form a south pole face. As a result, a continuous north-/south magnetic field extends from opposing pole faces on edge 87 and 93 principally centered about overlapping regions 95 on opposite corners of a square pattern. Meanwhile, the opposing right edge 89 of upper parabola 86a forms a south pole face while lower edge 97 of lower parabola 86b forms a north pole face. For this reason, the opposing alternate corners 99 of overlapping edges 87 and 97 on one hand, and 93 and 89 on the other hand, present pole faces of the same polarity and thereby do not impress a strong field through the interlying ferrite sheet 91. As a result, an oriented domain will be selectively written into regions 95 in the example thus far described. This is best diagrammatically depicted by the field lines shown in FIG. 12a. By reversing the direction of currents and drive wires 84a and 84b, the interaction of permeable parabolas 86a and 86b are reversed and domains will then be written into the ferrite sheet 91 at locations 99 rather than 95.

Therefore, the embodiments of FIGS. 12a and 12b represent an alternative design for the write elements. Two magnetic domains are created with each write cycle which provide a measure of redundancy for information reliability. By reversing the sense of current in drive lines 84a and 84b, the polarity of the field in regions 95 are thus reversed to allow for destructive readout as previously described. On the other hand, by reversing a single one of the drive lines 84a or b, information can be written into the alternate locations 99 in a similar manner. Therefore, the structure of FIGS. 12a and 12b represent a two bit per cell memory device wherein each bit includes a redundant magnetic situs. In a random access memory, clearly one drive line 84a, for example, can be treated as the bit drive line while the opposing othogonal drive line 84b is treated and organized within the memory as a byte drive line. Sense lines 101, shown in cross sectional view more clearly in FIG. 12a and in plan view in FIG. 12b, can then be used as described in connection with the above embodiments to sense whether a flux reversal has occurred in the case of a destructive readout. Alternatively, as described in greater connection with respect to FIGS. 16a and b and 27a and b, a SCS thyristor may be disposed with its cathode gate in the proximity of magnetic domains 95 and 99 as appropriate and the stored data then read from ferrite sheet 91 in a nonvolatile manner. Similarly, conventional Hall effect devices such as the type described in connection with FIG. 4, could also be disposed adjacent to memory domain areas 95 and 99 in order to amplify and sense the stored data in a nonvolatile manner. Sense wires 101 have been illustrated in FIGS. 12a and 12b only for the sake of simplicity and it is not intended that the write elements of the invention as here illustrated are necessarily restricted to a wire sensing device. Instead, the sensing element may be of any one of the types disclosed herein as well as means now known or hereafter devised which are equivalent thereto. For clarity of understanding, the operation and timing sequence of the embodiment of FIGS. 12a and 12b, wherein a wire sensing element 101 is used, will now be described in connection with FIG. 13. Appropriate modifications, of course, could be made with respect to the operation and its timing sequence depending upon the type of sensing device used in any application.

Turn now to FIG. 13 wherein the operation of the embodiment of FIG. 11 is better understood. FIG. 13 illustrates six timing sequences: (1) Clear or write-0; (2) Write-1; (3) Read-1; (4) Read-0; (5) Recall-1; and (6) Recall-0 or Write-0. Each of the six timing situations illustrated in FIG. 13 are depicted with respect to seven signals and are characterised by a change in the magnetic domain labelled as Mag Domain. The seven signals include a REWRITE/CLEAR or zero set signal 100; a WRITE-TIME signal 102; a first DRIVE 1 signal 104, applied to drive elements 84a of the device of FIGS. 12a and b; a second DRIVE 2 signal 106 applied to drive line 84b of the device of FIGS. 12a and b; the generated SENSE signal 108; a READ-TIMING signal 110; and a RECALL timing signal 112.

Consider first the interval depicted by CLEAR-0, WRITE-1, READ-1. The REWRITE/CLEAR signal 100 goes active with pulse 114. At that time, DRIVE 1 signal 104 goes negative with pulse 116 as does DRIVE signal 106 with pulse 118. The negative DRIVE 1 and DRIVE 2 pulses 116 and 118 will insert a 0 (by definition) into the corresponding magnetic domains 95 as shown in FIG. 13. A zero is denoted on the magnetic Domain line 120 as an open circle and as a 1 is denoted as a solid circle. The READ-TIMING signal goes active with pulse 122 at each time that both DRIVE 1 pulse 116 and DRIVE 2 pulse 118 go negative. Otherwise, READ-TIMING 110 remains a logical 0. In the embodiment illustrated in FIGS. 12a and b, the device is read, as previously described by impressing a 0 into the magnetic domain regardless of what state was originally stored. If the domain is 1, it is flipped and this reversal will be sensed on sense line 101. Otherwise, it will remain unchanged. Therefore, for the purposes of this illustration in the CLEAR-0 cycle of FIG. 13, the condition of the domain is not specified and the crosshatched box 124 on SENSE signal 108 indicates a "don't care" state, which is read in response to READ-TIMING signal 110 controlling the activation of DRIVE 1 signal 104 and DRIVE 2 signal 106 using conventional circuitry. A 0, now having been set in magnetic domains 95 in our example, is followed by a 1 which will be written into the domain in the next memory cycle. Here, WRITE-TIME signal 102 goes active at pulse 126. A binary 1 is written by a positive DRIVE 1 signal 104 at pulse 128 and a positive DRIVE 2 signal 106 at pulse 130. Since a 0 was stored previously in the magnetic domains, the domains will be flipped as indicated by pulse 132 on SENSE signal 108. Diagrammatically, the magnetic domain changes as depicted on line 120 by transitioning from an open to a closed circle.

During the next memory cycle in our example a read cycle is executed. During this time, READ-TIMING signal 110 goes active as shown by pulse 134 and DRIVE 1 signal 104 and DRIVE 2 signal 106 each again go negative as illustrated by pulses 136 and 138 respectively. This again impresses a 0 on magnetic domains 95, as drive lines 84a and b and focusing elements 86a and b in the device of FIGS. 12a and b are activated. Since a 1 was previously established in magnetic domains 95, it is flipped and the reversal of the magnetic domain will be sensed as SENSE signal 108 at pulse 140. Again, as diagrammatically depicted on line 120, the read cycle will transition the magnetic domain from a 1 state represented by a solid circle to a 0 state as represented by an open circle.

Suppose instead that a 0 had been written into the magnetic domains. Consider then a memory cycle wherein a 0 is then read. Once again, READ-TIMING signal 110 will go active with pulse 142. DRIVE 1 signal 104 and DRIVE 2 signal 108 will again go active negatively with pulses 144 and 146 respectively. However, since there is a 0 stored in the magnetic domains, there will be no flux reversal and there will be no transient signal impressed upon sense line 101 as indicated by the flat portion of SENSE signal 108.

As described, each time the magnetic domains are read it is rewritten as a 0. If the memory is to be permanent, the 0 or 1 which is initially stored in the location must then be rewritten. This is done by conventional circuitry which stores the read value and its location within temporary buffers. The temporarily stored address and data is then rewritten into the memory location, again with the use of conventional circuitry, and a recall memory cycle. FIG. 13 illustrates both a Recall-1 and Recall-0 cycle. Consider first a RECALL-1 cycle of FIG. 13. WRITE-TIME signal 102 goes active with a pulse 148. DRIVE 1 signal 104 and DRIVE 2 signal 106 again both go active with positive pulses 150 and 152 respectively. These elements impress a 1 upon magnetic domains 95 which is indicated by the flux reversal transient pulse 154 of SENSE signal 108. The recall timing signal controls conventional recall circuitry by a recall timing pulse 156. As diagrammatically depicted on line 120, the 0 which had previously been written into the domain when the memory location was read is now transitioned back to a 1 depicted by a closed circle.

Consider finally the RECALL-0 memory cycle. Once again, RECALL signal 112 goes active with pulse 158. The WRITE-TIMING signal 102 is also activated with pulse 160. However, in this case both DRIVE 1 signal 104 and DRIVE 2 signal 106 remain inactive so that the 0 which was previously written into the memory location during the read cycle remains in place without reversal. It is also possible as depicted in FIG. 13 that one of the signals DRIVE 1 104 or DRIVE 2 106 may go active. However, in the preferred embodiment activation of either one of these elements without a parallel activation of the other creates and insufficient magnetic field to cause a flux reversal.

Throughout the above description of operation in connection with FIG. 13, only magnetic domains 95 were discussed and the DRIVE 1 and DRIVE 2 signals were always activated in a parallel sense, that is, both either negative or positive. As previously described, it is also possible to store information in magnetic domains 99 by reversing the respective directions of the DRIVE 1 and DRIVE 2 currents in wire drives 84a and b. In this instance, the function of domains 95 and 99 simply interchange. The timing diagram of FIG. 13 would then be read by simply substituting the reverse polarity for the DRIVE 1 and DRIVE 2 signals. For example, a positive DRIVE 1 and a negative DRIVE 2 could be defined as writing a 0, while the reverse polarity of these two signals defined as writing a logical 1. Therefore, the embodiment of FIGS. 12a and b as described in connection with FIG. 13 represent a redundant double density memory with the memory mode being determined by the relative sense of the currents in wire drives 84a and 84b or equivalently DRIVE signals 1 and 2.

Return your attention now to FIGS. 12a and 12b which graphically depict an attribute of the invention. Sensing elements 101 whether they be wire-line sensing elements, Hall effect generators or thyristors, and write elements 86a and b and 84a and b are fabricated in opposing potted structures between which a homogenous ferrite sheet 91 is disposed. Therefore, the structure of the embodiment of FIGS. 12a and 12b represent an upper and lower read/write head between which the magnetic card is placed and into which the information is stored. The magnetic card can then be conveniently removed, shipped, stored or otherwise processed. The card is reinserted in the line according to conventional means which include both mechanical and electronic or optical servomechanisms in order to realign magnetic domains 95 and 99 with the appropriate structures in the overlying and underlying read/write heads.

It must also be understood that although the embodiment of FIGS. 12a and b have been described as parabolic permeable elements 86a and b, that any other shape well known to the art may be chosen. For example, elements 86a and b may in fact be a split ferrite core having a C-shaped rather than the curvalinear shape as suggested. Furthermore, drive lines 84a and b should also be read to include any wire or device capable of inducing a magnetic field within permeable members 86a and b or their topological equivalents. For example, it is entirely within the scope of the invention that the embodiment of FIGS. 12a and b may be practiced with ferrite cores and drive elements resembling those described in connection with the embodiments of FIGS. 14–16a and b, and FIGS. 27a and b. The invention has been described in connection with the embodiment of FIGS. 12a and 12b only for the purposes of clarity and example.

Turn now to another embodiment of the invention where destructive readout is not practiced. Consider, for example, the embodiment partially illustrated in FIG. 14 wherein a diagrammatic perspective of portions of five memory locations are depicted. FIG. 14 diagrammatically shows a single complete core structure and portions of four other core structures as geometrically embodied in the invention. Although the core structure of FIG. 14 would appear to be a freestanding core, such is not the fact and core 162 is shown in FIG. 14 in isolation only for the purposes of clearly illustrating the nature of the magnetic path. As will be described in greater detail in connection with the following Figures, the core structure of the nondestructive memory of the invention is fabricated according to integrated circuit techniques, and thus results in a structure substantially different than any core memory heretofore known.

The magnetic circuit, generally denoted by reference numeral 162 includes a ferromagnetic loop, here aribitrarily shown as a rectangular shape in which a gap 164 is provided. Although the illustration of FIG. 13 suggests that core 162 may be fabricated in separate horizontal and vertical components, it is also within the scope of the invention that a single integrated core could be fabricated as well. In fact, in the preferred embodiment the cores of the invention are fabricated using conventional integrated circuit techniques. In any case, core 162 includes a first horizontal leg 166 and a parallel opposing horizontal leg 168. Contiguous to upper and lower horizontal legs 166 and 168 at one end of core 162 is a shorter, vertical leg 170. Opposing and parallel to vertical leg 170 is a second vertical leg 172 at the opposing end of core 162. Vertical leg 172 differs from vertical leg 170 in that its shorter length defines gap 164 between vertical leg 172 and upper horizontal leg 166. A magnetic field is induced by means described below within core 162 and impressed across gap 164. A sensing device then reads the polarity of the magnetic field across gap 164 without reversal of the magnetic field within core 162. The core and the gap has ben shown diagrammatically and it must be understood that many other geometrical configurations for both the core and the gap could be utilized with equal facility. The embodiment of FIG. 16 shows one such alternative.

Turn now to FIG. 15 wherein the core of FIG. 14 is described in a partially completed perspective view in connection with a completed memory cell. FIG. 15 is highly diagrammatic and again is shown in a partially completed view only for the purposes of illustration and clarity. Core 162 of FIG. 14 has a magnetic field set up therein by the combined action of a pair of Y drives 166a and 166b and a pair of X drives 168a and 168b. For the purposes of clarity of illustration, half of core 170, shown in the foreground of FIG. 15, is illustrated in connection with lower Y drive 166b, while Y drive 166a is shown in place above core 162. As illustrated, upper and lower Y drives 166a and 166b generally perpendicularly cross each core arm while being generally disposed across the array of cores in the Y direction. In order to effect a perpendicular crossing in the X direction with a general Y displacement across the array of cores, upper and lower Y drive 166a and 166b are formed in a generally serpentine pattern. Corresponding to Y drive 166a, for example, is upper X drives 168a which are disposed through the cores in the X direction and which are placed opposite and adjacent Y drive 166a and inside the loop defined by the core. Thus, each perpendicular segment of Y drive 166a and its opposing segment of X drive 168a form a pair of wires used to create a field within core 162. The pair of driving lines formed by upper Y drive 166a and upper X drive 168a is duplicated on the opposing side of core 162 by a similarly constituted pair comprised of lower X drive 168b and lower Y drive 166b, not shown in the case of core 162, but more clearly illustrated in the case of a portion of core 170. Thus, it must be understood that in each core, despite that these portions have been omitted from FIG. 15, there are four wire pairs used to generate the desired magnetic field within the ferrite material of the core. The magnetic state is then written in a conventional manner into the core which retains the information in a nonvolatile manner and which can be read by a sensing line, not shown, or other sensing means well-known to the art disposed within gap 164 of core 162.

Figure 16B:
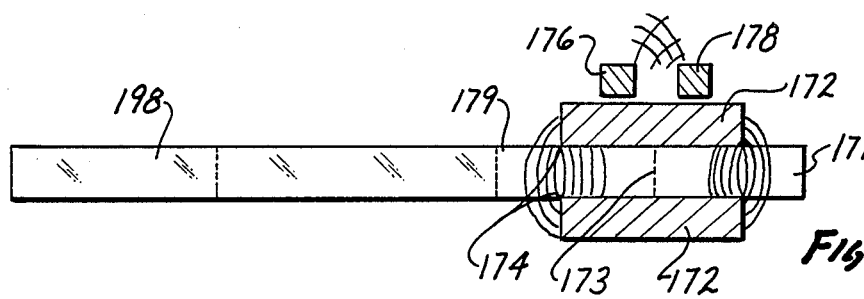
FIG. 16b is a sectional view of the embodiment of FIG. 16a taken through lines 16b—16b.
Figure 16A:
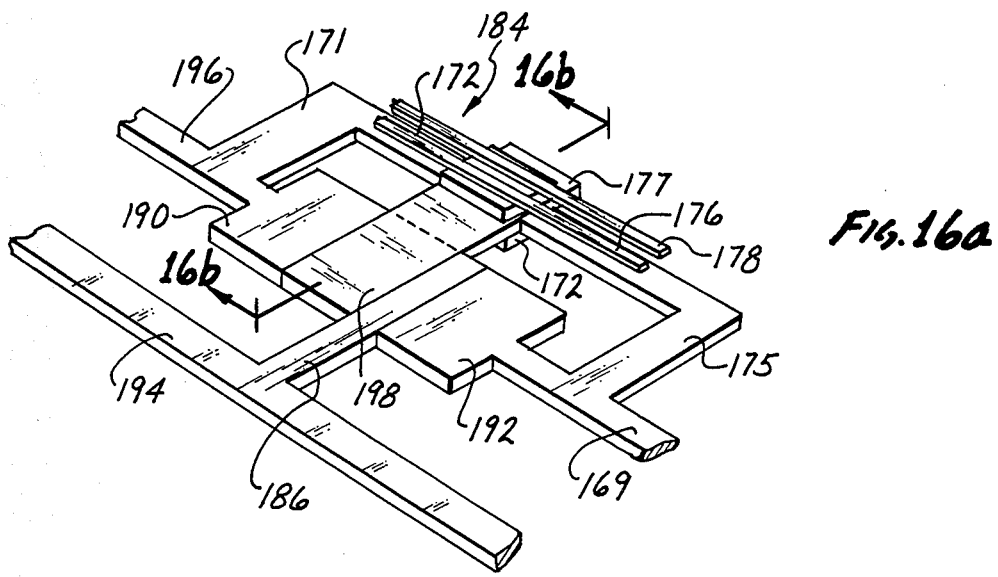
FIG. 16a is a diagrammatic perspective view of a seventh embodiment where a thyristor is used as a sense amplifier.

Turn now to the embodiment of FIGS. 16a and b wherein a pair of ferrite pole pieces, generally designated by reference numeral 172 are depicted as being horizontally oriented beneath a pair of bit and byte write drive lines 176 and 178, respectively. Lines 176 and 178 set up a flux within pole pieces 172 which generates a magnetic field across a gap 174 with a selected polarity. Again, the depiction of FIGS. 16a and 16b are diagrammatic and it is to be understood that the practical device is fabricated as an integrated circuit.

With continued reference to FIGS. 16a and b, the magnetic field within gap 174 is read by a thyristor, generally denoted by reference numeral 184, which includes an anode 192, an anode gate 186, a cathode 190 and cathode gate 188. Such device is well known to the art and is refered to as a Shockley four layer semiconductor thyristor. The form illustrated in FIG. 16a is known as a silicon controlled switch and all four semiconductor regions are accessible. Anode gate 192 is coupled to a bit select drive line 194 shown in FIG. 16a. Cathode 190 is connected to a bit output line 196. Cathode gate 198 is disposed into gap 174 defined by ferrite pole pieces 172.

Turn now to the cross sectional view taken through section lines 16b—16b of FIG. 16b. Cathode gate 198 extends into gap 174 between pole pieces 172 and forms an inner Hall effect junction region 199 and an outer Hall effect junction region 197. Outer and inner Hall effect junction regions 197 and 199 respectively are oppositely doped to provide an additive charge-carrier current despite the reversed magnetic field direction at each end of the pole pieces 172. The junction between regions 197 and 199 thus lies about halfway between the ends of pole pieces 172. Regions 197 and 199 are physical and electrical extensions of cathode gate 198 of the SCS thyristor device. A magnetic domain will be written into pole pieces 172 by appropriately driving bit write drive line 176 and byte write drive line 178 in a manner similar to that described above. In other words, if the drive lines 176 and 178 are driven in the same sense either a left or right oriented magnetic field will be impressed into the upper pole piece 172 depending on the direction of current flow. The opposing and adjacent pole piece 172 provides a means of completing the magnetic flux path through the two opposing pole faces on the upper piece. Thus, upper pole piece 172 adjacent drive lines 176 and 178 can thus be considered as presenting either a north pole bearing face toward cathode gate 198 or a south pole bearing face depending upon the orientation of the magnetic domains written into pole piece 172. The opposing lower pole piece 172 in completing the magnetic circuit of flux lines emanating from the oriented upper pole piece 172 thus also serves to maintain the magnetic lines of force through cathode gate 198 and in particular Hall effect junction regions 197 and 199 in as perpendicular an orientation as practical.

A transverse current is provided through Hall effect junction regions 197 and 199 by anode resistor 175 physically and electrically coupled to anode 192 as best depicted in FIG. 16a. Anode resistor 175 has its opposing terminal coupled to Hall effect junction regions 177 and 179 within gap 174 as indicated by dotted outlines 173 in the sectional view of FIG. 16b. The opposing side of Hall effect regions 177 and 179 are similarly electrically coupled to a cathode resistor 171 shown in FIG. 16a. Cathode resistor 171 in turn is coupled to cathode 190 or more particularly to bit output line 196. Therefore, the primary current is provided through anode resistor 175 and cathode resistor 171 when the byte select drive line 169 and anode 192 goes active as described in greater detail in connection with the memory embodiment of FIG. 20.

Assume, for example, that a bit has been written into pole pieces 172, or more probably the upper pole piece 172, by drive lines 178 and 176. Magnetic lines of force are then established approximately at 90° or right angles through the Hall effect junction regions 177 and 179. When bit select drive line 169 is inserted or goes active, current will begin to flow through the opposing Hall effect regions 177 and 179 and a Hall effect voltage with a predetermined polarity will be impressed across the Hall effect junction depending upon the sense of the magnetic field in the gap 174. Therefore, cathode gate 198 will then be either depleted or filled with charge carriers. A short time later, limited only by the response times of the Hall effect device, bit select drive line 194 will be activated thereby enabling anode gate 186. The thyristor will then conduct if the bias of cathode gate 198 is appropriate, otherwise it will remain nonconductive. As will be discussed in connection with FIG. 20 with respect to a random access memory incorporating thyristor sensing elements such as shown in FIGS. 16a and b, this change in resistance or conductivity is an amplified indication of the stored, nonvolatile memory state within pole piece 172. However, before considering how memory cells of the structure of FIGS. 16a and 16b are combined to form a random access memory, turn now to an additional embodiment of the invention in a nonvolatile memory read by thyristor.

Turn now to the pictorial perspective illustration of FIG. 27a. In this embodiment of the invention, a nearly C-shaped ferrite core 300 is formed as a thin film, and defines or is broken by a narrow gap 302. Gap 302 further defines a midline slot 304 into opposing arms 306 and 308 of C-shaped core 300. A conductive bit write drive line 310 is disposed over ferrite core 300 and assumes a shape substantially congruent therewith. In other words, at least one and preferably three sides of C-shaped core 300 has a congruent conductive overlay defining drive line 310. The drive lines could be arranged to cover at least part of the fourth side of core 300 including gap 302. Similarly, on the opposing side of ferrite core is a congruently shaped bit right drive line 312. As in the case with drive lines 176, 178 in the embodiment of FIG. 16a, drive lines 310 and 312 of the embodiment of FIG. 27a are used to impress a predetermined magnetic domain within ferrite core 300.

The orientation of the magnetic domain is better understood by turning to FIG. 27b which is a cross sectional view taken through lines 27b—27b of FIG. 27a. Antiparallel currents through drive lines 310 and 312 will set up an oriented domain within core 300 lying in the plane of the C-shaped core as diagrammatically depicted by arrows 314 in FIG. 27b. A nonvolatile orientation of magnetic domains in the direction of arrow 314, in effect, creates a flat strip magnet which produces a fringing magnetic field across slot 304 as diagrammatically depicted by magnetic field lines 316. Disposed within, between or near gap 302 and slots 304 is a cathode gate 198 as previously described in connection with FIGS. 16a and 16b. For ease of reference, each of the elements of the thyristor in FIG. 27a and their respective lines, have been referenced by the same numerals as used in connection with FIGS. 16a. The operation of the thyristor of FIG. 27a is therefore identical to that described in FIG. 16b, including the provision of a transverse current through cathode resistor 171 and anode resistor 175 by lines coupled to junction regions 177 and 179 (not shown) which physically and electrically form part of cathode gate 198 disposed in or in the proximity of slot 304 and gap 302. For simplicity of illustration, the embodiment of FIGS. 27a and 27b have shown, particularly in FIG. 27b, a cathode gate 198 disposed immediately adjacent and beneath slot 304. However, it is entirely within the scope of the art that all or at least a portion of Hall effect junctions 177 and 179 of cathode gate 198 could be disposed in slot 304 and gap 302 if the field within slot 304 or gap 302 were to be exploited. The fringing field as diagrammatically depicted by force lines 316 are instead used as the approximately perpendicular magnetic field lines through Hall effect junction regions 177 and 179. An opposing pole face, such as a ferrite pole face, could thus be disposed below Hall effect junction regions 177 and 179 as shown in FIG. 27b to further straighten the penetrating lines of magnetic force through regions 177 and 179 and to provide a preferred and more complete magnetic path for the magnetic field fringing from slot 304 and perpendicularly oriented through Hall effect regions 177 and 179.

However, it must be understood that when a thyristor sensed RAM is later discussed in connection with the embodiment of FIG. 20, that either of the devices of FIGS. 16a and b, or 27a and b as presently contemplated or their equivalents modified according to the present teaching may be interchangeably used.

Consider now a memory using a Hall effect device as a sensing element. The utilization of the memory cells of FIG. 4 in a random access memory (RAM) is better depicted and understood in connection with the embodiment of FIG. 17. Turning now to FIG. 17 a plurality of memory cells 195 and 197 are depicted in a two-dimensional array. In the illustrated embodiment, bit cells 195 are diagrammatically depicted as passive or inactive Hall effect devices. Cells 197 are depicted as memory cells having an active Hall generator which has been enabled by the corresponding bit/word select line 199. Bit/word select line 199 is driven by a conventional byte-drive amplifier 200. Similarly, the transverse terminals of each cell 195 and 197 are coupled in series to a column bit select line 201 and is pulsed or driven by a conventional bit select amplifier 202. Thus, each of the memory cells or more particularly the corresponding Hall effect device 195 and 197 in each of the memory cells can be arbitrarily and randomly selected by appropriate activation of the corresponding bit select line 201 and the byte select line 199. In the illustrated depiction of FIG. 17 the byte select line 199 of BYTE 1 has gone active as diagrammatically depicted by pulse 204 shown at the output of the corresponding byte drive amplifier 200. The plurality of Hall effect generators corresponding to memory cells 197 are then powered up and each of the bit select lines B0-B7 are pulsed, thereby providing output signal on sense lines 203 which are coupled to the input of conventional bit sense amplifiers 206. The passive Hall effect devices 195 will appear as single resistive elements. The active Hall effect devices will, however, appear as voltage generators which generate a voltage of a polarity dependant on the polarity of the magnetic field to which the Hall effect device is exposed. The voltage difference can then be sensed in amplifiers 206 as a 0 or 1. Thus, the memory cells of FIG. 17 may be used in the embodiment of FIG. 4 or in connection with nonvolatile core of the types as shown in FIGS. 14–16. In the latter case thyristor 184 of FIG. 16 would then be replaced by a Hall effect device. The output of bit sense amplifiers 206 are in turn coupled to a conventional parallel data register 208 which transfers the read information to a data bus in a conventional manner. Thus, insofar as the outward appearance and utilization of the sheet random access memory (SHRAM) of type depicted in the embodiment of FIG. 16 is concerned, the SHRAM appears no different to the remaining portions of the computer system in which it may be used than conventional dynamic memories.

The illustration of the embodiment of FIG. 17 shows a means for powering and selecting the Hall effect generators whereby the information can be read as stored within a random access magnetic memory using the embodiment of FIGS. 3, 4, or 14–16. Turn now to FIG. 20 wherein a more detailed diagram is provided for the purpose of explaining the operation of the thyristor devices in a RAM. In FIG. 20 device 184 shown within the dotted outline is diagrammatically depicted as equivalent to its semiconductor analog which physically corresponds to either one of the embodiments of FIGS. 16a and b or 27a and b. When a selected byte select line 169 at the output of a correspondingly selected byte driver 205 goes active, the anode 192 of SCS device 184 is powered or goes active. A load 210 is also coupled to the output of driver 205 to provide constant load characteristics. Bit select lines 194 are then pulsed, thereby causing each of the the anode gates 186 to go active. According to the bias provided then to cathode gate 198 by the Hall effect voltage created by the nonvolatile memory core, cathode 190 will then be selectively driven into conductive state providing an output signal on a bit output line 196. As discussed before the transverse Hall current is provided through anode resistor 175 and cathode resistor 171 from byte driver 205 coupled thereto through drive line 169. The bits are then read in parallel from each of the memory cells corresponding to the selected byte. The byte length is of course arbitrary and may be chosen to 8, 16, 32, 64, 128 bits or any other length as desired. Bit drives 211 then buffer the read byte which is loaded into a conventional register 213 which may be parallel or serial register as desired.

Figure 20:
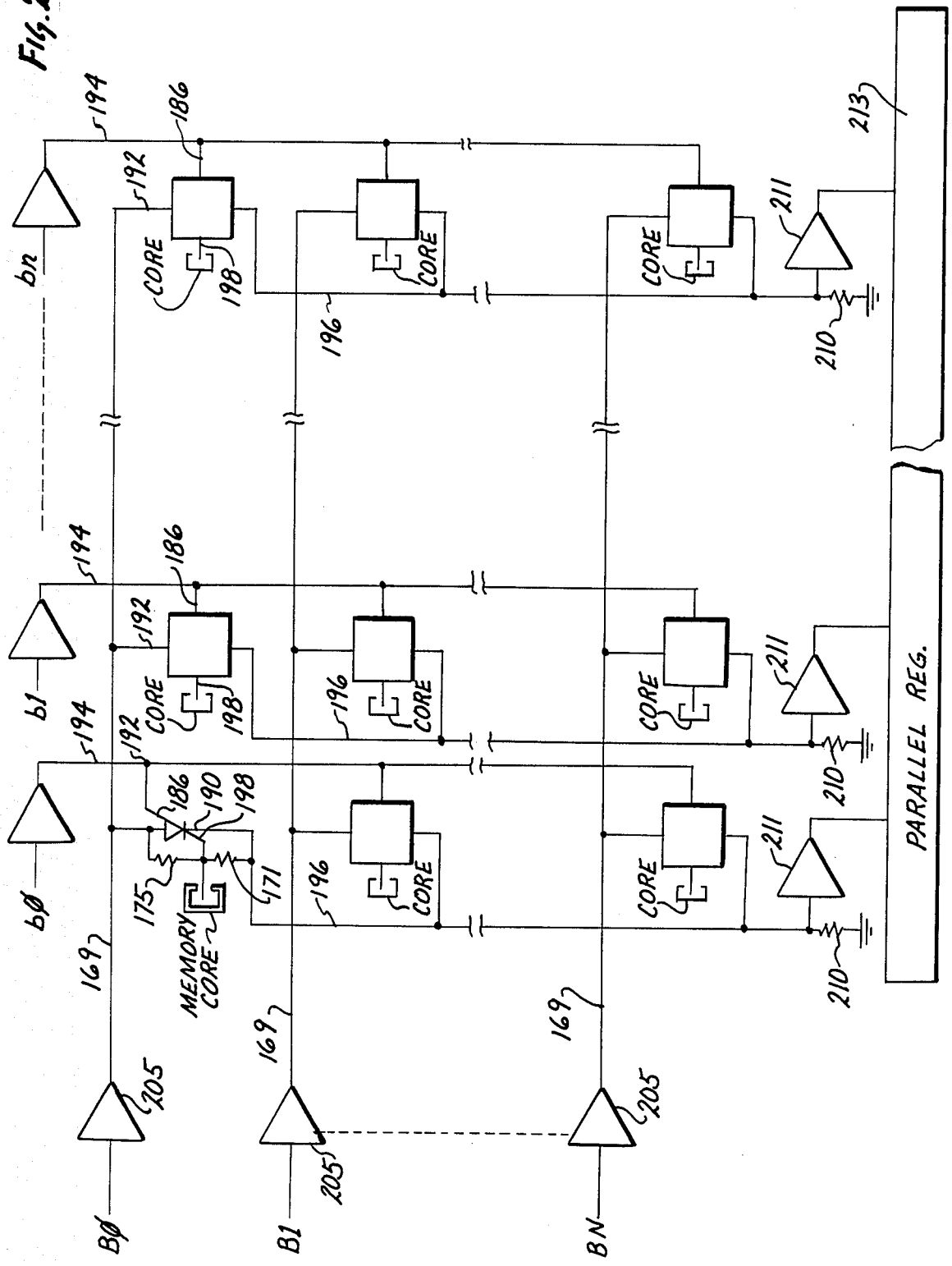
FIG. 20 is a random access memory using the memory cell as described in connection with FIGS. 14 and 15.

Although the random access parallel memories as described in connection with FIGS. 17 and 20 are expected to have the greatest utility, it is also possible to use the SHRAM circuitry as a serial memory as shown in FIG. 18. For example, consider the serial adjacent Hall effect device through an interconnecting capacitor 220. The resistive property of the Hall effect device in connection with capacitor 220 thus provides a serial time delay from one bit to the next. The transverse voltage, which is representative of the bit value, is provided between the input sense line 218 and the output sense line 224. Output sense line 224 in turn is coupled to a FIFO (first in, first out) conventional register 226. The asynchronous propagation of the bit select signal 215 through the plurality of memory cells 216 and their respective Hall effect devices is also used to asynchronously run the counter within register 226. Thus, a group of bits is serially assembled within register 226 which can then be provided as a serial or parallel output. Byte select line 212 is terminated with a resistive load 222 in order to provide a drain circuit for the Hall effect devices.

Turn now to FIG. 19 where another Hall effect memory is described wherein a clocked serial pulse is read as opposed to the asynchronous serial readout of the embodiment shown in FIG. 18. Again, the memory of FIG. 19 incorporates simple Hall effect devices and not the thyristor described in connection with FIG. 16. In the embodiment of FIG. 19, a number of sets of a plurality of serially connected memory cells are provided. More specifically, memory cells 228 form a first set corresponding to BYTE 0 while memory cells 230 form a second set corresponding to BYTE N. An arbitrary number of additional sets are included therebetween corresponding to BYTES 1 to N−1. In the embodiment of FIG. 19 only two such sets have been illustrated although any number could be included. Each set of memory cells 228 or 230 also includes an arbitrary number of memory cells, each for example incorporating a ferrite core and a simple Hall effect device reading the magnetic field in the gap of the core. Hall effect devices are coupled in the two-dimensional array in substantially the same manner as described in connection with FIG. 17, except the biasing current from the output of drive amplifiers 238 through the Hall effect drive is used as the bit select lines B0-BN. The magnetic field will create a transverse potential to this biasing current. However, only one of the plurality of drive amplifiers is selectively activated. Therefore, each of the remaining Hall effect devices, except the activated one, namely 228a, will be passively resistive to the transverse current diagrammatically depicted by pulse 233 at the output of byte drive amplifier 234. Pulse 233 is coupled to the byte/select line 232. A logical 1 or 0 will thus be impressed upon byte line 232 according to the 0 or 1 stored within the corresponding magnetic cell which was activated, namely 228a. The logical state will be sensed and amplified by byte/select amplifier 240 which is also enabled by the corresponding byte/select signal. The output of sense amplifier 240 is then coupled to a conventional FIFO register 242 which will assemble the bits as they are sequentially clocked according to the sequence by which bit select lines 236 go active. An enabling signal BYTE/SELECT 0-BYTE/SELECT N is required for each of the sense amplifiers 240 since their outputs are commonly connected and undesirable stray currents or "networking" of the Hall devices in the nonselected byte lines might interfere with the accurate and reliable readout from the selected byte line.

Turn now to FIG. 21 wherein packaging for the invention is described. A diagrammatic partially cut-away perspective view of the package is shown wherein a conventional printed circuit card 244 is mechanically encased within a protective housing 246. Housing 246 not only provides conventional thermomechanical protection, but includes a magnetic shieldling layer, such as a mu metal which prevents the magnetically stored information written on substrate 248 from being altered by any type of electromagnetic interference. Substrate 248 may include thyristor devices of FIG. 13 in the SHRAM memory of FIG. 20 or may include the Hall effect devices as illuatrated in connection with FIG. 4 either with a sheet substrate or with ferrite core bodies as described in connection with FIGS. 14-16 fabricated according to integrated circuit photolithography. In any case, the packaging of FIG. 21 provides a rugged and entirely transportable nonvolatile memory unit which can be shipped from user to user without special precautions and which will arrive with all information intact.

Turn to FIG. 8 which conceptually illustrates a READ/WRITE device wherein the memories described in connection with FIGS. 1-13 may be used. A housing unit 11 includes the sense lines, drive lines, shields and focusing elements and other devices as described in connection with the embodiment of FIGS. 1-7 and 9-13. Such memory elements as described may be double sided or single sided. In other words, the embodiments of FIGS. 1-4 represent single sided units. The embodiments of FIG. 5-7, although shown as a single sided units and thus could be so constructed, could also be duplicated as described to constitute a double sided unit. The embodiment of FIG. 12 is expressly shown as a double sided unit. In either case, the one or two sides can be included within the inner upper and lower surfaces (not shown) of appropriate circuit boards within unit 11. These drive and read elements are then brought into close physical contact with a two dimentional substrate 13 which provides the memory media. 0s and 1s are appropriately written onto substrate 13 which is mechanically and/or electronically registered within housing 11 in the proximity to the read/write units as described. Substrate 13, which is in the form of a rigid or flexible card, can then be inserted and removed for reading and writing as desired. It is contemplated that substrate 13 is a single substantially homogenous sheet of ferromagnetic material or at least has a ferromagnetic layer disposed thereon.

Such material or layer need not, of course, be homogenous but may be further subdivided by conventional photolithographic techniques into a corresponding plurality of isolated ferromagnetic cells, domains, or regions. Each such cell could be separated by nonferromagnetic material and more particularly by a boundary layer of a magnetically shielding substance such as the high permeability mu metal. Thus, when properly registered according to conventional techniques within housing 11, each cell will be appropriately aligned with the corresponding selected read/write device. Crosstalk between the cells, if it should become a problem due to cell density, can be substantially eliminated or reduced by electromagnetic separation or shielding between adjacent ferromagnetic domains. Substrate 13 can then be easily transported and provides a nonvolatile memory media which is randomly accessible.

Figure 22:
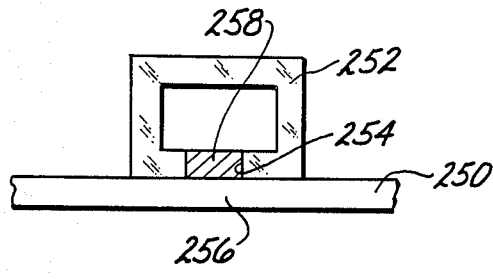
FIG. 22 is a diagrammatic front view of an eighth embodiment of the invention.
Figure 23:
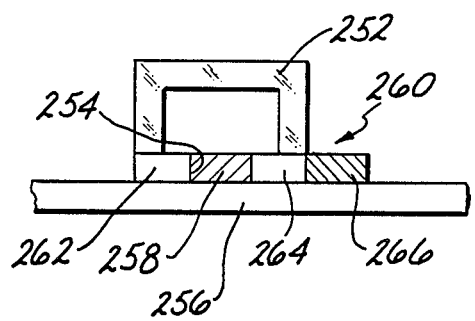
FIG. 23 is a diagrammatic rear view of the embodiment of FIG. 22.
Figure 24:
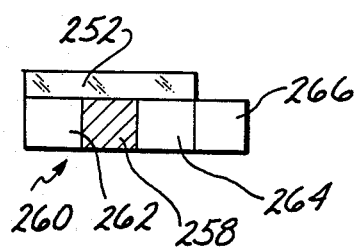
FIG. 24 is a diagrammatic plan view of the embodiment of FIGS. 22 and 23.

Turn now to FIG. 22 which illustrates yet another embodiment of the invention which employs a two dimensional ferromagnetic substrate 250 as the memory media. A ferrite core 260 similar to those previously described in connection with FIGS. 15-16 is disposed above and in close proximity to substrate 250. Typically, core 260 will be in physical contact with substrate 250 such that a gap 262 defined within core 260 lies immediately above a distinguishable memory location denoted by region 256. The SCS thyristor as described in connection with FIG. 16 is then utilized to read gap 254 in the same manner as described in FIG. 16. A magnetic field is set up within core 252 by orthogonal X and Y drive lines (not shown) such as those shown and described in connection with FIG. 15. FIG. 22 represents a rear side elevational view of the core and of cathode gate 258 disposed within gap 254 of core 252. The field set up within core 252 will cause an oriented magnetic domain to be established at region 256 at substrate 250. Thereafter, the stored value is read by SCS thristor 260. FIG. 23 illustrates a front side view of the same device while FIG. 24 represents a plane view. Cathode 262, cathode gate 258, anode gate 264 which may be used as a bit select and anode 266 which is used as a byte select are each clearly shown in FIGS. 23 and 24.

Therefore, in the embodiment of FIGS. 22-24, the stored information may reside solely within region 256 of substrate 250 or jointly within region 256 and its corresponding core 252. In this embodiment, region 256 of substrate 250 serves to complete the magnetic path across gap 254 and to retain the magnetic state of the path even when the driving currents are quiescent. Although the embodiment of FIGS. 22-24 have been shown as disposed on one side of substrate 250, it is entirely within the scope of the invention that substrate 250 could be double-sided and separated by a stiffening and magnetically shielding layer in much the same manner as depicted in connection with the embodiment of FIG. 12. Similarly, magnetic core 252 and thyristor 260 would be duplicated on the under side of substrate 250 as well as on its upper side as shown in the illustrated embodiment.

Figure 25:
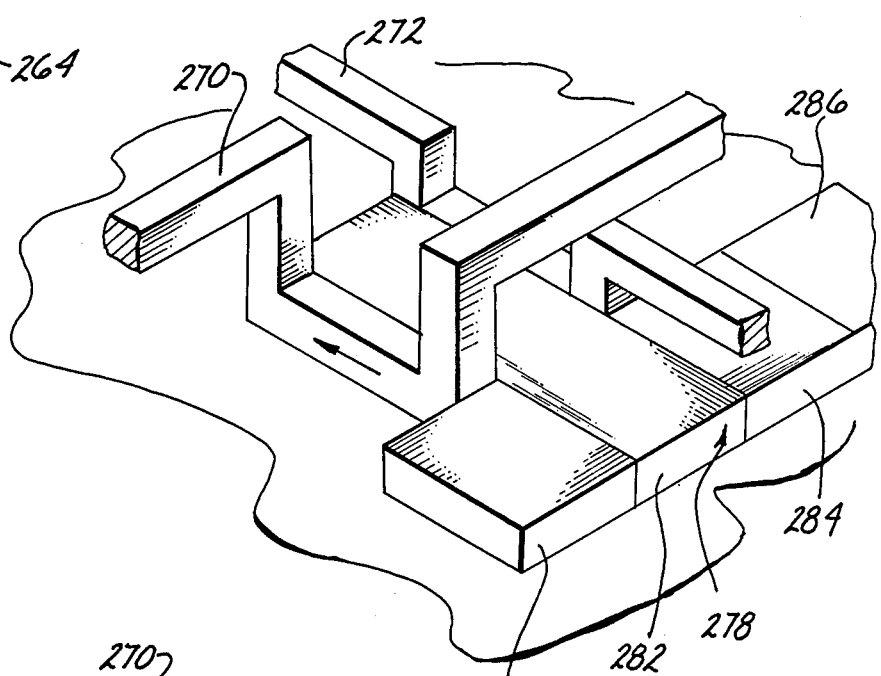
FIG. 25 is a diagrammatic perspective view of a ninth embodiment of the invention.
Figure 26:
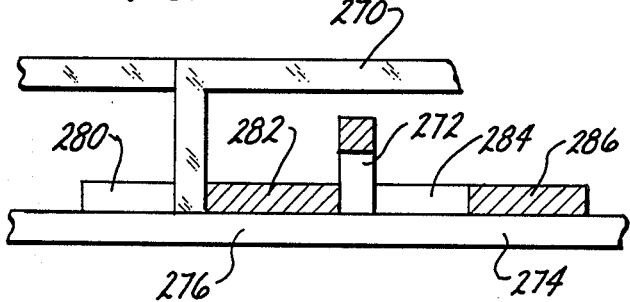
FIG. 26 is a diagrammatic side view of the embodiment of FIG. 25.

FIG. 25 is a diagrammatic perspective view of still another embodiment of the invention wherein a byte drive line 270 and bit drive line 272 create a oriented magnetic domain within sheet substrate 274. As before, the stored field within region 276 (FIG. 26) of substrate 274 is read by an SCS thyristor generally denoted by reference numeral 278. Thyristor 278 includes cathode 280, cathode gate 282, anode gate 284 and anode 286. Cathode gate 282 is disposed immediately over and in the proximity of region 276 as best illustrated in FIG. 26. In a manner similar to that described in the embodiment of FIG. 6, byte select line 270 generally runs in the X direction while bit select line 272 generally runs in a perpendicular Y direction. At the point of the memory cell characterized by distinguishable location 276 and the two dimensional, generally homogenous substrate 274, lines 270 and 272 are parallel in order to selectively impress a magnetic orientation at region 276. Between the drive coils formed by byte select 270 and bit select line 272 is cathode gate 282 of thyristor 278.

Although not depicted, a Hall effect device could similarly be substituted in either of the embodiments of FIGS. 25-26 or FIGS. 22-24 in place of the thyristor. Furthermore, although the embodiments of FIGS. 22-26 have been diagrammatically shown as what appears to be freestanding three dimensional circuit structures, it must be understood that the memory cells are fabricated according to conventional photolithographic semiconductor techniques and are thus embedded with a suitable insulating and nonmagnetic substrate disposed above and parallel to the underlying magnetic substrate 250 or 274.

Thus, what has been described in the illustrated embodiments is a truly random nonvolatile memory which does not require the circuit or software overhead as typified by dynamic random access memories and which avoids the slow response and large current requirements of conventional core memories. The SHRAM memory is directly accessible and limited only by its own write rates so that a substantial amount of input/output software overhead can be avoided. In the nonvolatile embodiments as compared to dynamic random access memories, substantial amounts of system overhead which is necessary to accommodate the dynamic memory, can be deleted. Using current mode logic, a high noise-to-signal ratio can be obtained with read times comparable to conventional core memories. The speed of the memory is in fact only limited by its write rate which approaches the minimal time during which a magnetic domain can be reversed, namely of the order of one megahertz.

The invention has been set forth above in certain illustrated embodiments only for the purposes of clarity and example. It must be expressly understood that many modifications may be made by those having ordinary skill in the art without departing from the spirit and scope of the invention. Therefore, the illustrated embodiment must not be taken as a limitation of the invention which is defined by the following claims.

We claim:

1. A nonvolatile random access memory comprising:
    a substrate including a plurality of separate magnetically polarizable ferromagnetic domains at a corresponding plurality of distinguishable fixed locations;
    fixed drive means for selectively creating a fixed predetermined net magnetic polarization of at least some of said domains within said substrate at a randomly accessed one of said distinguishable fixed locations by aligning at least some of said domains at said fixed location without propagation of a magnetic region within said substrate; and
    fixed sensing means for selectively sensing the direction of magnetic polarity of an arbitrarily selected one of said plurality of distinguishable ferromagnetic domains,
    whereby a true, random, nonvolatile mass memory is provided.

2. The memory of claim 1 wherein said fixed drive means comprises:
    a plurality of pairs of conductive lines wherein each pair of conductive lines is disposed in proximity to said substrate and is mutually parallel for a portion of their length only at one of said fixed locations, said pair of conductive lines for providing a conductive path for parallel and antiparallel currents only at said one fixed location wherein an electromagnetic field corresponding to a predetermined magnetic polarity is selectively impressed upon said distinguishable location within said substrate thereby selectively creating a predetermined direction of net magnetic polarity of the magnetic domains therein corresponding to said electromagnetic field at said one fixed location.

3. The memory of claim 1 wherein said fixed sensing means comprises a sensing conductive line disposed in proximity to said substrate, said substrate being planar at the point of proximity of said line and substrate and said corresponding distinguishable location wherein transition of magnetic polarity at said distinguishable location induces a flux reversal signal in said sensing conductive line.

4. The memory of claim 1 wherein said fixed sensing means comprises a semiconductor device disposed in the proximity of said substrate and of said distinguishable location therein, wherein net magnetic polarity of said distinguishable location is impressed upon said device, thereby creating a response therein indicative of the direction of said net magnetic polarity assumed at said corresponding distinguishable location in said substrate, each said semiconductor device comprising a cathode semiconductor region, an adjacent cathode gate region electrically coupled thereto, an adjacent anode gate region electrically coupled thereto, and an adjacent anode region electrically coupled in turn to said anode gate region, said cathode gate region being disposed in part adjacent to and magnetically coupled to said magnetic domains of one of said fixed locations, said net magnetic polarity causing a predetermined redistribution of charge carriers in said cathode gate region, said predetermined redistribution of charge carriers setting up a bias voltage between said cathode region and said remaining other regions of said device to selectively control current flowing through said device corresponding to said direction of net magnetic polarity of said domains at said fixed location corresponding to each said device.

5. The memory of claim 1 wherein said drive means comprises at least one conductive element disposed adjacent to said substrate for generating an electromagnetic field within said substrate at said distinguishable location and at least one focusing element for focusing said electromagnetic field generated by said conductive element into the proximity of said distinguishable location.

6. The memory of claim 1 wherein said fixed drive means comprises a pair of conducting lines disposed in proximity to said substrate and being mutually parallel for a portion of their length only at said fixed locations, said pair of conductive lines for providing a conductive path for parallel and antiparallel currents only at said one fixed location wherein an elecromagnetic field corresponding to a first and second predetermined direction of net magnetic polarity is selectively impressed upon said magnetic domains at said one distinguishable location within said substrate; and
wherein said sensing means comprises a semiconductor thyristor electromagnetically coupled to said magnetic field impressed upon said distinguishable location within said substrate.

7. The memory of claim 1 wherein said substrate comprises a plurality of unconnected ferromagnetic regions corresponding to said plurality of distinguishable fixed locations.

8. The memory of claim 1 wherein said substrate comprises a unitary layer of ferromagnetic material.

9. The memory of claim 1 wherein said fixed drive means comprises a first and second plurality of conductive lines, each line of said first plurality of lines having a parallel and straight segment proximate to a straight segment of each one of said second plurality of lines, positions of mutually proximity of said straight and parallel segments defining one of said distinguishable fixed locations in said substrate.

10. The memory of claim 1 wherein said substrate includes a plurality of fixed separate ferromagnetic core structures integrally formed in said substrate, each ferromagnetic core providing a polarized magnetic circuit through said core and across a magnetic gap defined by said core for storing binary information within said core structure across said gap within said substrate, said sensing means for sensing the predetermined polarized magnetic field established within said core across said gap in said substrate.

11. The memory of claim 10 wherein said sensing means comprises a semiconductor device disposed in said gap and formed integrally in said substrate, said semiconductor device comprising a cathode semiconductor region, an adjacent cathode gate region electrically coupled thereto, an adjacent anode gate region electrically coupled thereto, and an adjacent anode region electrically coupled in turn to said anode gate region, said cathode gate region being disposed in part adjacent to and magnetically coupled to said magnetic domains of one of said fixed locations, said net magnetic polarity causing a predetermined redistribution of charge carriers in said cathode gate region, said predetermined redistribution of charge carriers setting up a bias voltage between said cathode region and said remaining other regions of said device to selectively control current flowing through said device corresponding to said direction of net magnetic polarity of said domains at said fixed location corresponding to each said device.

12. The memory of claim 10 wherein said substrate is planar, the perpendicular to said planar substrate being defined as vertical, and wherein said ferromagnetic core is planar and is integrally fabricated within said substrate so that said planar core lies in a plane parallel to said vertical, said core having an open interior, said drive means disposed integrally in said substrate, adjacent to said core and within said interior of said core to form a plurality of pairs of conductive, parallel opposing lines for carrying a current within said lines for the establishment of a predetermined magnetic field within said core.

13. A nonvolatile random access memory comprising:
a substrate including a plurality of separate magnetically polarizable ferromagnetic domains at a corresponding plurality of distinguishable fixed locations;
fixed drive means for selectively creating a fixed predetermined net magnetic polarization of at least some of said domains within said substrate at a randomnly accessed one of said distinguishable fixed locations by aligning at least some of said domains at said fixed location without propagation of a magnetic region within said substrate; and
fixed sensing means for selectively sensing the direction of magnetic polarity of an arbitrarily selected one of said plurality of distinguishable ferromagnetic domains,
wherein said substrate includes a plurality of fixed separate ferromagnetic core structures integrally formed in said substrate, each ferromagnetic core providing a polarized magnetic circuit through said core and across a magnetic gap in said substrate defined by said core for storing binary information within said core structure across said gap within said substrate, said sensing means for sensing the magnetic field established within said core across said gap,
wherein said sensing means comprises a semiconductor disposed in said magnetic field across said gap and formed integrally in said substrate, said semiconductor device comprising a cathode semiconductor region, an adjacent cathode gate region electrically coupled thereto, an adjacent anode gate region electrically coupled thereto, and an adjacent anode region electrically coupled in turn to said anode gate region, said cathode gate region being disposed in part adjacent to and magnetically coupled to said magnetic domains of one of said fixed locations, said net magnetic polarity causing a predetermined redistribution of charge carriers in said cathode gate region, said predetermined redistribution of charge carriers setting up a bias voltage between said cathode region and said remaining other regions of said device to selectively control current flowing through said device corresponding to said direction of net magnetic polarity of said domains at said fixed location corresponding to each said device, whereby a true, random, nonvolatile mass memory is provided.

14. The memory of claim 13 wherein said substrate is planar, and said ferromagnetic core is planar, said planar core being disposed in said substrate in a coplanar orientation to said planar substrate, and integrally fabricated within said substrate, said core defining an open interior, said drive means disposed adjacently above and adjacently below said core and configured to comprise a plurality of parallel opposing conductive lines on each side of said planar core, said opposing parallel lines for carrying currents therein to selectively form a predetermined magnetic field within said core.

15. The memory of claim 13 wherein said thyristor is a silicon controlled switch including an anode, anode gate, cathode gate and cathode, said cathode gate being disposed at least in the proximity of said gap of said core wherein said thyristor is responsively controlled by the magnetic state of said core.

16. A nonvolatile random access memory comprising:
a substrate including a plurality of separate fixed locations of magnetic domains arranged and configured in a two-dimensional array in said substrate, each fixed location of magnetic domains capable of assuming a first or second direction of net magnetic polarity;
a corresponding plurality of semiconductor devices for sensing said magnetic polarity, each said semiconductor device comprising a cathode semiconductor region, an adjacent cathode gate region electrically coupled thereto, an adjacent anode gate region electrically coupled thereto, and an adjacent anode region electrically coupled in turn to said anode gate region, said cathode gate region being disposed in part adjacent to and magnetically coupled to said magnetic domains of one of said fixed locations, said net magnetic polarity causing a predetermined redistribution of charge carriers in said cathode gate region, said predetermined redistribution of charge carriers setting up a bias voltage between said cathode region and said remaining other regions of said device to selectively control current flowing through said device corresponding to said direction of net magnetic polarity of said domains at said fixed location corresponding to each said device, said devices arranged and configured into a two-dimensional array wherein one of said devices corresponds to one of said plurality of fixed locations of magnetic domains, each corresponding device disposed in the proximity of each corresponding fixed location of magnetic domains and electromagnetically coupled therewith, said plurality of devices divided into a set of subpluralities wherein each subplurality of devices comprises a row of devices, each row of devices being serially electrically connected with each other along a first current orientation of each device, each device within said row of devices being electrically connected with a corresponding device in another row of said devices along a second current orientation of each device, said second current orientation being substantially transverse to said first current orientation,
whereby a row of said devices can be selectively biased by application of a byte/select signal across said serial connection along said first current orientation and wherein at least one of said columns of devices is selectively provided with a sensing current so that the device in said selected row and column generates a responsive indicative of the net polarity of the corresponding magnetic domains at said corresponding fixed location in said substrate.

17. The memory of claim 16 further comprising a plurality of output drivers, each output driver having an input coupled to a corresponding one of said serially connected column of semiconductor devices, whereby the output of said output driver serially generates a signal corresponding to said magnetic domain corresponding to each one of said serially connected devices in said selected column as said devices are biased in sequence by serial activation of each one of said plurality of rows of devices by serially providing in sequence a current along said first current orientation of each device within said selected column.

18. The memory of claim 16 wherein said two-dimensional array of magnetic domains included within said substrate is comprised of a two-dimensional array of separate fixed ferromagnetic core structures integrally fabricated within said substrate for storing binary information within said core within said substrate.

19. A nonvolatile random access memory comprising:
a substrate including a plurality of magnetic domains with a predetermined net magnetic polarity at each one of a plurality of separated fixed locations in said substrate;
a plurality semiconductor devices for determining direction of magnetic polarity, one device corresponding to each one of said plurality of said fixed locations in said substrate, said plurality of devices being organized into a plurality of sets of said devices, each set comprising a predetermined number of said devices and said set denoted as a binary word, said devices in said word serially coupled in circuit with each other, each serially coupled device being coupled for flow of current along a first current orientation within each device, a substantially transverse current being provided along a second current orientation within each device, each said semiconductor device comprising a cathode semiconductor region, an adjacent cathode gate region electrically coupled thereto, an adjacent anode gate region electrically coupled thereto, and an adjacent anode region electrically coupled in turn to said anode gate region, said cathode gate region being disposed in part adjacent to and magnetically coupled to said magnetic domains of one of said fixed locations, said net magnetic polarity causing a predetermined redistribution of charge carriers in said cathode gate region, said predetermined redistribution of charge carriers setting up a bias voltage between said cathode region and said remaining other regions of said device to selectively control current flowing through said device corresponding to said direction of net magnetic polarity of said domains at said fixed location corresponding to each said device,
whereby a pulse serially propagated along said devices comprising said word serially generates a response across said transverse current direction as said pulse propagates through said word, said serially generated responses corresponding to a serial reading of said magnetic domains corresponding to each of said devices within said word.

* * * * *

UNITED STATES PATENT AND TRADEMARK OFFICE
CERTIFICATE OF CORRECTION

PATENT NO. : 4,791,604
DATED : December 13, 1988
INVENTOR(S) : Richard M. Lienau; Kenneth E. Pope It is certified that error appears in the above-identified patent and that said Letters Patent are hereby corrected as shown below:

Column 26, line 5, the word "responsive" should read --response--.

Signed and Sealed this

Thirteenth Day of February, 1990

Attest:

JEFFREY M. SAMUELS

Attesting Officer     Acting Commissioner of Patents and Trademarks